US011469076B2

(12) United States Patent
Massen et al.

(10) Patent No.: US 11,469,076 B2
(45) Date of Patent: Oct. 11, 2022

(54) SYSTEM AND METHOD FOR SCANNING A SAMPLE USING MULTI-BEAM INSPECTION APPARATUS

(71) Applicant: ASML Netherlands B.V., Veldhoven (NL)

(72) Inventors: Martinus Gerardus Maria Johannes Massen, San Francisco, CA (US); Joost Jeroen Ottens, Veldhoven (NL); Long Ma, San Jose, CA (US); Youfei Jiang, Milpitas, CA (US); Weihua Yin, Santa Clara, CA (US); Wei-Te Li, Santa Clara, CA (US); Xuedong Liu, San Jose, CA (US)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 17/251,724

(22) PCT Filed: Jun. 7, 2019

(86) PCT No.: PCT/EP2019/064919
§ 371 (c)(1),
(2) Date: Dec. 11, 2020

(87) PCT Pub. No.: WO2019/238553
PCT Pub. Date: Dec. 19, 2019

(65) Prior Publication Data
US 2021/0217582 A1 Jul. 15, 2021

Related U.S. Application Data

(60) Provisional application No. 62/850,461, filed on May 20, 2019, provisional application No. 62/787,227, (Continued)

(51) Int. Cl.
H01J 37/26 (2006.01)
H01J 37/147 (2006.01)
(Continued)

(52) U.S. Cl.
CPC ........ H01J 37/265 (2013.01); H01J 37/1474 (2013.01); H01J 37/222 (2013.01);
(Continued)

(58) Field of Classification Search
CPC .......... H01J 37/00; H01J 37/02; H01J 37/265; H01J 37/1474; H01J 37/222; H01J 37/28;
(Continued)

(56) References Cited

U.S. PATENT DOCUMENTS 6,946,655 B2  9/2005  Almogy et al.
7,084,411 B2  8/2006  Lammer-Pachlinger et al.
(Continued)

FOREIGN PATENT DOCUMENTS

JP  2007-317467 A  12/2007
JP  2018-017526 A  2/2018
(Continued)

OTHER PUBLICATIONS

International Search Report and Written Opinion issued by the International Searching Authority in related International Application No. PCT/EP2019/064919, dated Aug. 30, 2019 (12 pgs.).
(Continued)

Primary Examiner — Jason L McCormack
(74) Attorney, Agent, or Firm — Finnegan, Henderson, Farabow, Garrett & Dunner, LLP

(57) ABSTRACT

An improved system and method for inspection of a sample using a particle beam inspection apparatus, and more particularly, to systems and methods of scanning a sample with a plurality of charged particle beams. An improved method of scanning an area of a sample using N charged particle
(Continued)

beams, wherein N is an integer greater than or equal to two, and wherein the area of the sample comprises a plurality of scan sections of N consecutive scan lines, includes moving the sample in a first direction. The method also includes scanning, with a first charged particle beam of the N charged particle beams, first scan lines of at least some scan sections of the plurality of scan sections moving towards a probe spot of the first charged particle beam. The method further includes scanning, with a second charged particle beam of the N charged particle beams, second scan lines of at least some scan sections of the plurality of scan sections moving towards a probe spot of the second charged particle beam.

15 Claims, 27 Drawing Sheets

Related U.S. Application Data filed on Dec. 31, 2018, provisional application No. 62/684,138, filed on Jun. 12, 2018.

(51) Int. Cl.
*H01J 37/22* (2006.01)
*H01J 37/28* (2006.01)

(52) U.S. Cl.
CPC ....... *H01J 37/28* (2013.01); *H01J 2237/1505* (2013.01); *H01J 2237/24592* (2013.01); *H01J 2237/2817* (2013.01)

(58) Field of Classification Search
CPC ..... H01J 2237/1505; H01J 2237/24592; H01J 2237/2817

USPC ......................................... 250/306, 307, 311
See application file for complete search history.

(56) References Cited

U.S. PATENT DOCUMENTS

| | | |
|---|---|---|
| 7,399,647 B2 | 7/2008 | Reinhorn |
| 7,468,506 B2 | 12/2008 | Rogers et al. |
| 7,468,507 B2 | 12/2008 | Rogers et al. |
| 2010/0127431 A1 | 5/2010 | Sandström |
| 2012/0241606 A1 | 9/2012 | Han et al. |
| 2015/0021493 A1 | 1/2015 | Platzgummer |
| 2015/0155134 A1 | 6/2015 | Frosien et al. |
| 2017/0243716 A1* | 8/2017 | Ogasawara ............. H01J 61/28 |
| 2018/0024082 A1* | 1/2018 | Ando ................. G01N 23/2251 250/310 |

FOREIGN PATENT DOCUMENTS

| | | |
|---|---|---|
| TW | 201704736 A | 2/2017 |
| TW | 201812289 A | 4/2018 |
| WO | WO 2018/063325 A1 | 4/2018 |

OTHER PUBLICATIONS

Office Action issued by the Chinese Intellectual Patent Office (IPO) in related ROC (Taiwan) Patent Application No. 108120097, dated Apr. 23, 2020 (13 pgs.).
Notice of Reasons for Rejections issued in related Japanese Patent Application No. 2020-566995; dated Feb. 1, 2022 (8 pgs.).
Final Notice of Reasons for Rejection from the Japan Patent Office issued in related Japanese Patent Application No. 2020-566995; dated Jul. 27, 2022 (7 pgs.).

* cited by examiner

SYSTEM AND METHOD FOR SCANNING A SAMPLE USING MULTI-BEAM INSPECTION APPARATUS

CROSS-REFERENCE TO RELATED APPLICATIONS

This application claims priority to International Application No. PCT/EP2019/064919, filed Jun. 7, 2019, and published as WO 2019/238553 A1, which claims priority of U.S. application 62/684,138 which was filed on Jun. 12, 2018, U.S. application 62/787,227 which was filed on Dec. 31, 2018, and U.S. application 62/850,461 which was filed on May 20, 2019. The contents of these applications are incorporated herein by reference in their entireties.

FIELD

The embodiments provided herein generally relates to inspection of a sample using a particle beam inspection apparatus, and more particularly, to systems and methods of scanning a sample with a plurality of charged particle beams.

BACKGROUND

When manufacturing semiconductor integrated circuit (IC) chips, pattern defects or uninvited particles (residuals) inevitably appear on a wafer or a mask during fabrication processes, thereby reducing the yield. For example, uninvited particles may be troublesome for patterns with smaller critical feature dimensions, which have been adopted to meet the increasingly more advanced performance requirements of IC chips.

Pattern inspection tools with a charged particle beam have been used to detect the defects or uninvited particles. These tools typically employ a scanning electron microscope (SEM). In a SEM, a beam of primary electrons having a relatively high energy is decelerated to land on a sample at a relatively low landing energy and is focused to form a probe spot thereon. Due to this focused probe spot of primary electrons, secondary electrons will be generated from the surface. The secondary electrons may comprise backscattered electrons, secondary electrons, or Auger electrons, resulting from the interactions of the primary electrons with the sample. By scanning the probe spot over the sample surface and collecting the secondary electrons, pattern inspection tools may obtain an image of the sample surface.

SUMMARY

The embodiments provided herein disclose a particle beam inspection apparatus, and more particularly, an inspection apparatus using a plurality of charged particle beams.

In some embodiments, a multi-beam tool is provided. The multi-beam tool includes a beam configuration system including: a charged-particle source for generating a primary beam of charged particles, a stage holding a sample, and a deflector system between the charged-particle source and the stage configured to split the primary beam into an array of beams. The beam configuration system is configured to provide a rotated beam configuration with a rotation angle determined based on a number of beams in a row of the array of beams.

In some embodiments, a multi-beam tool is provided. The multi-beam tool includes a charged-particle source for generating a primary beam of charged particles, a stage configured to hold a sample and configured to move in a first direction; and a deflector system between the charged-particle source and the stage. The deflector system is configured to: split the primary beam into n beams, wherein n is an integer and n≥2; rotate the n beams with reference to the first direction, such that the n beams are spaced apart along the first direction; deflect the n beams to simultaneously i) follow movement of the stage and ii) scan one or more sets of n scan lines over a surface of the sample.

In some embodiments, a multi-beam tool is provided. The multi-beam tool includes a beam configuration system including a charged-particle source configured to generate a primary beam of charged particles, a stage configured to hold a sample and configured to move in a first direction, and a deflector system between the charged-particle source and the stage. The deflector system is configured to split the primary beam into an array of beams. The beam configuration system is configured to: deflect, via the deflector system, the array of beams to i) scan a first set of scan lines in a field of view of the beam configuration system and ii) follow movement of the stage during the scanning of the first set of scan lines, wherein the first set of scan lines are spread over a first distance along the first direction; after the first set of scan lines is scanned, move the stage in the first direction by the first distance; and deflect, via the deflector system, the array of beams to i) scan a second set of scan lines in the field of view of the beam configuration system and ii) follow movement of the stage during the scanning of the second set of scan lines; and move the stage in the first direction, when the first and second sets of scan lines are scanned.

In some embodiments, a method of controlling a plurality of charged-particle beams to scan a sample is provided. The method includes: generating, by a multi-beam tool, a primary beam of charged particles; splitting, by the multi-beam tool, the primary beam into an array of beams; and rotating, by the multi-beam tool, the array of beams relative to a sample to be scanned by a rotation angle determined based on a number of beams in a row of the array of beams.

In some embodiments, a method of controlling a plurality of charged-particle beams to scan a sample is provided. The method includes: moving, by a multi-beam tool, a sample in a first direction; generating, by the multi-beam tool, a primary beam of charged particles; splitting, by the multi-beam tool, the primary beam into n beams, wherein n is an integer and n≥2; rotate the n beams with reference to the first direction, such that the n beams are spaced apart along the first direction; deflecting, by the multi-beam tool, the n beams to simultaneously i) follow movement of the sample and ii) scan one or more sets of n scan lines over a surface of the sample.

In some embodiments, a method of controlling a plurality of charged-particle beams to scan a sample is provided. The method includes: moving a sample in a first direction; generating, by a multi-beam tool, a primary beam of charged particles; splitting, by the multi-beam tool, the primary beam into an array of beams; deflecting, by the multi-beam tool, the array of beams to i) scan a first set of scan lines in a field of view of the multi-beam tool and ii) follow movement of the sample during the scanning of the first set of scan lines, wherein the first set of scan lines are spread over a first distance along the first direction; after the first set of scan lines is scanned, moving, by the multi-beam tool, the sample in the first direction by the first distance; deflecting, by the multi-beam tool, the array of beams to i) scan a second set of scan lines in the field of view of multi-beam tool and ii) follow movement of the sample during the scanning of the second set of scan lines; and moving, by the multi-beam tool, the sample in the first direction, when the first and second sets of scan lines are scanned.

In some embodiments, a non-transitory computer-readable medium storing a set of instructions is provided. The set of instructions is executable by a controller coupled to a multi-beam tool to cause the controller to perform a method including: instructing a beam configuration system of the multi-beam tool to rotate an array of charged-particle beams relative to a sample to be scanned by the multi-beam tool, by a rotation angle determined based on a number of beams in a row of the array of beams. The multi-beam tool generates a primary beam of charged particles and splits the primary beam into the array of charged-particle beams.

In some embodiments, a non-transitory computer-readable medium storing a set of instructions is provided. The set of instructions is executable by a controller coupled to a multi-beam tool to cause the controller to perform a method including: instructing a sample stage of the multi-beam tool to move a sample in a first direction, the multi-beam tool generating a primary beam of charged particles and splitting the primary beam into n beams, wherein n is an integer and n≥2; instructing a beam configuration system of the multi-beam tool to rotate the n beams with reference to the first direction, such that the n beams are spaced apart along the first direction; instructing the beam configuration system to deflect the n beams to simultaneously i) follow movement of the sample and ii) scan one or more sets of n scan lines over a surface of the sample.

In some embodiments, a non-transitory computer-readable medium storing a set of instructions is provided. The set of instructions is executable by a controller coupled to a multi-beam tool to cause the controller to perform a method including: instructing a sample stage of the multi-beam tool to move a sample in a first direction, the multi-beam tool generating a primary beam of charged particles and splitting the primary beam into an array of beams; instructing a beam configuration system of the multi-beam tool to deflect the array of beams to i) scan a first set of scan lines in a field of view of the multi-beam tool and ii) follow movement of the sample during the scanning of the first set of scan lines, wherein the first set of scan lines are spread over a first distance along the first direction; after the first set of scan lines is scanned, instructing the sample holder to move the sample in the first direction by the first distance; instructing the beam configuration system to deflect the array of beams to i) scan a second set of scan lines in the field of view of multi-beam tool and ii) follow movement of the sample during the scanning of the second set of scan lines; and moving the sample in the first direction, when the first and second sets of scan lines are scanned.

The disclosed embodiments provide a method of scanning an area of a sample using N charged particle beams, wherein N is an integer greater than or equal to two, and wherein the area of the sample comprises a plurality of scan sections of N consecutive scan lines. The method includes moving a position of the sample in a first direction; scanning, with a first charged particle beam of the N charged particle beams, first scan lines of at least some scan sections of the plurality of scan sections moving towards a probe spot of the first charged particle beam; and scanning, with a second charged particle beam of the N charged particle beams, second scan lines of at least some scan sections of the plurality of scan sections moving towards a probe spot of the second charged particle beam.

The disclosed embodiments provide a non-transitory computer readable medium storing a set of instructions that is executable by one or more processors of a charged particle beam system to cause the charged particle beam system, with a charged particle beam source to deliver N charged particle beams to a surface of a sample over a time sequence, to perform a method. The method includes moving a position of the sample in a first direction; scanning, with a first charged particle beam of the N charged particle beams, first scan lines of at least some scan sections of the plurality of scan sections moving towards a probe spot of the first charged particle beam; and scanning, with a second charged particle beam of the N charged particle beams, second scan lines of at least some scan sections of the plurality of scan sections moving towards a probe spot of the second charged particle beam.

The disclosed embodiments also provide a method of scanning a sample by a multi-beam inspection system that utilizes N-by-M charged particle beams, N being an integer that is greater than or equal to two. The method includes positioning the N charged particle beams to enable each beam of the N charged particle beams to scan a different scan line of a first set of N adjacent scan lines; scanning, by use of the N charged particle beams, the first set of N adjacent scan lines of a sample while the sample is moving at a first speed in a first direction; repositioning, relative to initiation of the scanning of the first set of N adjacent scan lines, the N charged particle beams to enable each beam of the N charged particle beams to scan a different scan line of a second set of adjacent scan lines; and scanning, by use of the N charged particle beams, the second set of N adjacent scan lines of the sample while the sample is moving at the first speed in the first direction.

The disclosed embodiments also provide a method of scanning a sample positioned on a stage by a multi-beam inspection system that utilizes N-by-M array of charged particle beams, N and M each being an integer that is greater than or equal to two. The method includes positioning the N-by-M array of charged particle beams to enable each beam of the N-by-M array of charged particle beams at a first set of positions to scan a different scan section of a first set of N-multiplied-by-M scan sections of the sample. The method also includes scanning, by use of the N-by-M array of charged particle beams, scan lines of at least some scan sections of the first set of N-multiplied-by-M scan sections of the sample while the stage is moving at a first speed in a first direction. The method also includes repositioning, relative to initiation of the scanning of the first set of N-multiplied-by-M scan sections, the N-by-M array of charged particle beams to enable each beam of the N-by-M array of charged particle beams at a second set of positions to scan a different scan section of a second set of N-multiplied-by-M scan sections of the sample. The method also includes scanning, by use of the N-by-M array of charged particle beams, scan lines of at least some scan sections of the second set of N-multiplied-by-M scan sections of the sample while the stage is moving at the first speed in the first direction.

Other advantages of the present disclosure will become apparent from the following description taken in conjunction with the accompanying drawings wherein are set forth, by way of illustration and example, certain embodiments of the present invention.

BRIEF DESCRIPTION OF FIGURES

The above and other aspects of the present disclosure will become more apparent from the description of exemplary embodiments, taken in conjunction with the accompanying drawings.

DETAILED DESCRIPTION

Figure 1:
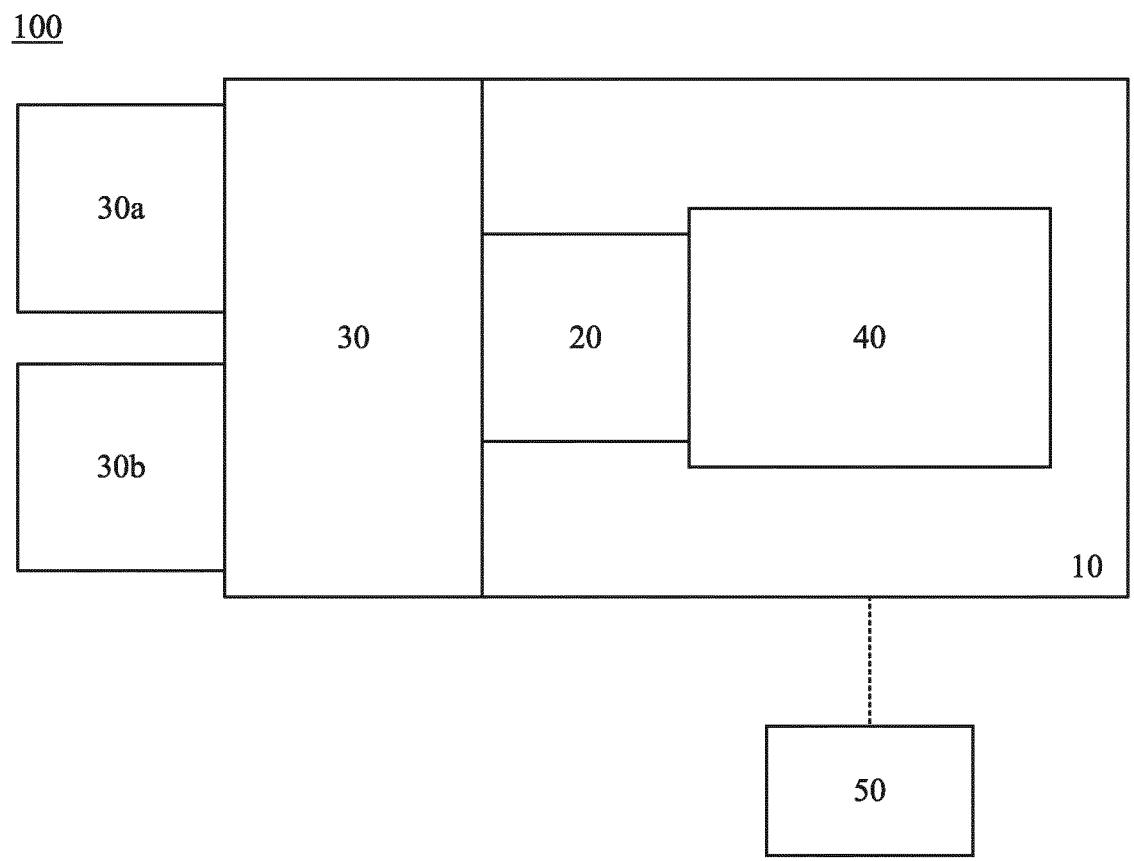
FIG. 1 is a schematic diagram illustrating an exemplary charged particle beam inspection system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than $1/1000$th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective, then the process can be adjusted so the defect is less likely to occur again.

A SEM scans the surface of a sample with a focused beam of primary electrons. The primary electrons interact with the sample and generate secondary electrons. By scanning the sample with the focused beam and capturing the secondary electrons with a detector, the SEM creates an image of the scanned area of the sample.

The conventional SEM generates images by raster scanning an electron beam over a sample held on a stage. The raster scan is performed by repeatedly: moving the primary beam to scan a line of pixels across the sample; and after reaching the last pixel of the scan line, moving the primary beam back to scan the first pixel of the next line to scan that line of pixels. The extra time required/spent for moving the beam from the last pixel in one line to the first pixel in the next line is called line overhead. Usually in the conventional SEM system, the stage is kept stationary while the primary electron beam raster scans the sample area (e.g., a set of one or more scan lines) within its field of view. After the area is fully scanned, the stage makes a jump to move an unscanned sample area into the field of view, such that the primary beam can start scanning the new area. For high throughput inspection, some of the newer inspection systems use multiple electron beams. As multiple electron beams can scan different parts of wafer at the same time, multi-beam electron inspection system can inspect a wafer at much higher speed than a single-beam system.

Typically, however, even these newer systems with multiple electron beams still employ the same raster scanning technique while the sample stage is held stationary. After the multiple beams finish scanning the current sample areas within their respective fields of views, the sample stage or the beams may need to make a big "jump" to the unscanned sample areas. Moreover, the scanning may need to stop every time when the sample stage moves and can only resume after the stage fully settles, which also adds up to a significant amount of un-productive time.

One of the aspects of the present disclosure relates to a system and a method of arranging, configuring, or controlling a plurality of electron beams to scan a sample simultaneously and continuously. As described in detail below, the disclosed systems and methods may reduce or minimize the line overhead associated with raster scanning or the wait time for stage movement. Furthermore, the disclosed systems and methods can optimize the movements of the multiple electron beams into a simple repetitive up-and-down motion, without the need of the big "jumping" movement to the unscanned area, thereby improving the throughput of the overall inspection and reducing the complexity of control mechanism for that multi-beam tool.

Relative dimensions of components in drawings may be exaggerated for clarity. Within the following description of drawings the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Reference is now made to FIG. 1, which is a schematic diagram illustrating an exemplary charged particle beam inspection system 100, consistent with embodiments of the present disclosure. As shown in FIG. 1, charged particle beam inspection system 100 includes a main chamber 10, a load lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 includes a first loading port 30a and a second loading port 30b. EFEM 30 may include additional loading port(s). First loading port 30a and second loading port 30b may, for example, receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load lock chamber 20.

Load lock chamber 20 may be connected to a load lock vacuum pump system (not shown), which removes gas molecules in load lock chamber 20 to reach a first pressure below the atmospheric pressure. After reaching the first pressure, one or more robot arms (not shown) transport the wafer from load lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40. In some embodiments, electron beam tool 40 may comprise a single-beam electron inspection tool. In other embodiments, electron beam tool 40 may comprise a multi-beam electron inspection tool.

A controller 50 is electronically connected to electron beam tool 40. Controller 50 may be a computer configured to execute various controls of charged particle beam inspection system 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools that operate under the second pressure.

Figure 2:
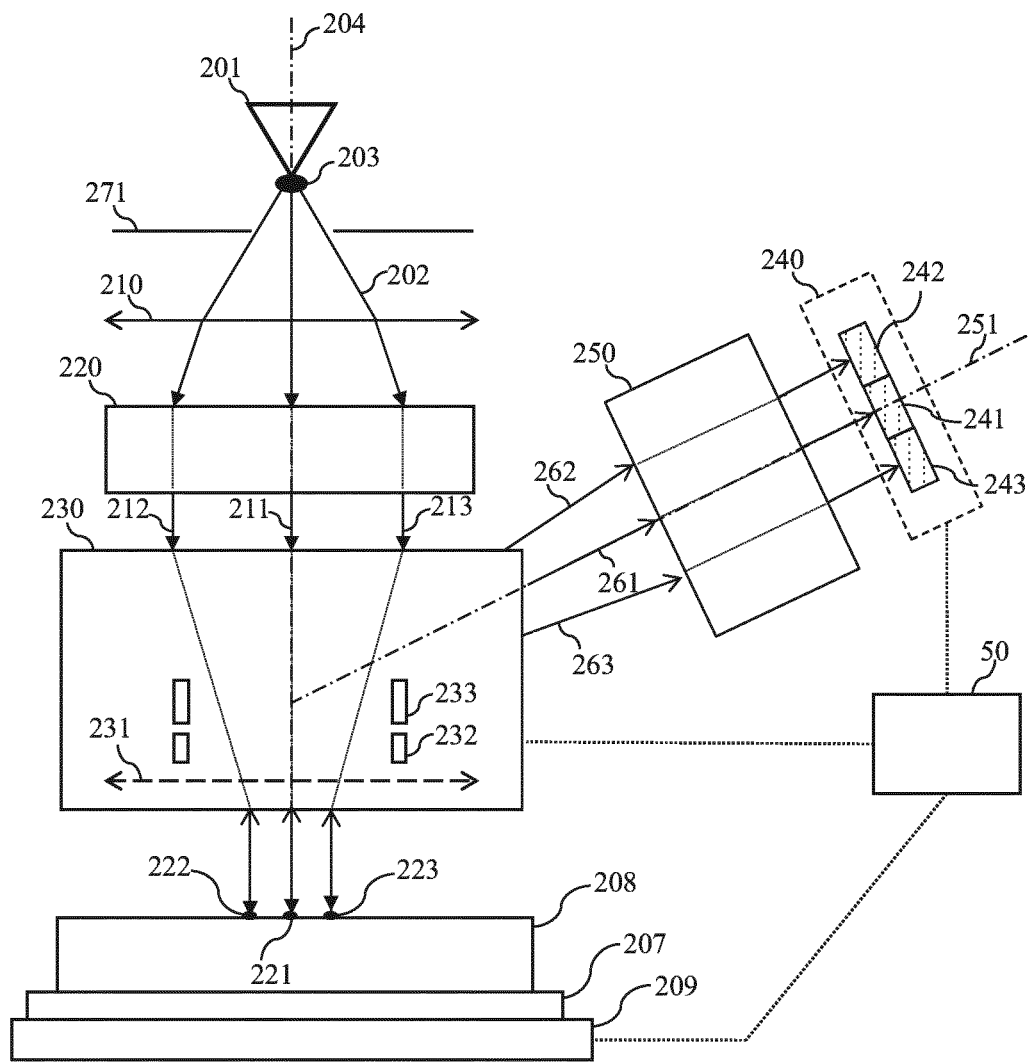
FIG. 2 is a schematic diagram illustrating an exemplary electron beam tool, consistent with embodiments of the present disclosure.

Reference is now made to FIG. 2, which is a schematic diagram illustrating an exemplary electron beam tool 40 including a multi-beam electron inspection tool that is part of the exemplary charged particle beam inspection system 100 of FIG. 1, consistent with embodiments of the present disclosure. Multi-beam electron beam tool 40 (also referred to herein as apparatus 40) comprises an electron source 201, a gun aperture plate 271, a condenser lens 210, a source conversion unit 220, a primary projection optical system 230, a motorized stage 209, and a sample holder 207 supported by motorized stage 209 to hold a sample 208 (e.g., a wafer or a photomask) to be inspected. Multi-beam electron beam tool 40 may further comprise a secondary projection system 250 and an electron detection device 240. Primary projection optical system 230 may comprise an objective lens 231. Electron detection device 240 may comprise a plurality of detection elements 241, 242, and 243. A beam separator 233 and a deflection scanning unit 232 may be positioned inside primary projection optical system 230.

Electron source 201, gun aperture plate 271, condenser lens 210, source conversion unit 220, beam separator 233, deflection scanning unit 232, and primary projection optical system 230 may be aligned with a primary optical axis 204 of apparatus 40. Secondary projection system 250 and electron detection device 240 may be aligned with a secondary optical axis 251 of apparatus 40.

Electron source 201 may comprise a cathode (not shown) and an extractor or anode (not shown), in which, during operation, electron source 201 is configured to emit primary electrons from the cathode and the primary electrons are extracted or accelerated by the extractor and/or the anode to form a primary electron beam 202 that forms a primary beam crossover (virtual or real) 203. Primary electron beam 202 may be visualized as being emitted from primary beam crossover 203.

Source conversion unit 220 may comprise an image-forming element array (not shown), a field curvature compensator array (not shown), an astigmatism compensator array (not shown), and a beam-limit aperture array (not shown). The image-forming element array may comprise a plurality of micro-deflectors or micro-lenses to influence a plurality of primary beamlets 211, 212, 213 of primary electron beam 202 and to form a plurality of parallel images (virtual or real) of primary beam crossover 203, one for each of the primary beamlets 211, 212, and 213. The field curvature compensator array may comprise a plurality of micro-lenses to compensate field curvature aberrations of the primary beamlets 211, 212, and 213. The astigmatism compensator array may comprise a plurality of micro-stigmators to compensate astigmatism aberrations of the primary beamlets 211, 212, and 213. The beam-limit aperture array may be configured to limit diameters of individual primary beamlets 211, 212, and 213. FIG. 2 shows three primary beamlets 211, 212, and 213 as an example, and it is appreciated that source conversion unit 120 may be configured to form any number of primary beamlets. Controller 50 may be connected to various parts of charged particle beam inspection system 100 of FIG. 1, such as electron detection device 240, primary projection optical system 230, or motorized stage 209. In some embodiments, as explained in further details below, controller 50 may perform various image and signal processing functions. Controller 50 may also generate various control signals to govern operations of charged particle beam inspection system 100.

Condenser lens 210 is configured to focus primary electron beam 202. Condenser lens 210 may further be configured to adjust electric currents of primary beamlets 211, 212, and 213 downstream of source conversion unit 220 by varying the focusing power of condenser lens 210. Alternatively, the electric currents may be changed by altering the radial sizes of beam-limit apertures within the beam-limit aperture array corresponding to the individual primary beamlets. The electric currents may be changed by both altering the radial sizes of beam-limit apertures and the focusing power of condenser lens 210. Condenser lens 210 may be a movable condenser lens that may be configured so that the position of its first principle plane is movable. The movable condenser lens may be configured to be magnetic, which may result in off-axis beamlets 212 and 213 landing on a beamlet-limit mechanism with rotation angles. The rotation angles change with the focusing power and the position of the first principal plane of the movable condenser lens. In some embodiments, the movable condenser lens may be a movable anti-rotation condenser lens, which involves an anti-rotation lens with a movable first principal plane.

Objective lens 231 may be configured to focus beamlets 211, 212, and 213 onto a sample 208 for inspection and may form, in the current embodiments, three probe spots 221, 222, and 223 on the surface of sample 208. Gun aperture plate 271, in operation, is configured to block off peripheral electrons of primary electron beam 202 to reduce Coulomb effect. The Coulomb effect may enlarge the size of each of probe spots 221, 222, and 223 of primary beamlets 211, 212, 213, and therefore deteriorate inspection resolution.

Beam separator 233 may, for example, be a Wien filter comprising an electrostatic deflector generating an electrostatic dipole field and a magnetic dipole field (not shown in FIG. 2). In operation, beam separator 233 may be configured to exert an electrostatic force by electrostatic dipole field on individual electrons of primary beamlets 211, 212, and 213. The electrostatic force is equal in magnitude but opposite in direction to the magnetic force exerted by magnetic dipole field of beam separator 233 on the individual electrons. Primary beamlets 211, 212, and 213 may therefore pass at least substantially straight through beam separator 233 with at least substantially zero deflection angles.

Deflection scanning unit 232, in operation, is configured to deflect primary beamlets 211, 212, and 213 to scan probe spots 221, 222, and 223 across individual scanning areas in a section of the surface of sample 208. In response to incidence of primary beamlets 211, 212, and 213 at probe spots 221, 222, and 223, electrons emerge from sample 208 and generate three secondary electron beams 261, 262, and 263. Each of secondary electron beams 261, 262, and 263 typically comprise electrons having different energies including secondary electrons (having electron energy ≤50 eV) and backscattered electrons (having electron energy between 50 eV and the landing energy of primary beamlets 211, 212, and 213). Beam separator 233 is configured to deflect secondary electron beams 261, 262, and 263 towards secondary projection system 250. Secondary projection system 250 subsequently focuses secondary electron beams 261, 262, and 263 onto detection elements 241, 242, and 243 of electron detection device 240. Detection elements 241, 242, and 243 are arranged to detect corresponding secondary electron beams 261, 262, and 263 and generate corresponding signals which are sent to controller 50 or a signal processing system (not shown), e.g. to construct images of the corresponding scanned areas of sample 208.

In some embodiments, detection elements 241, 242, and 243 detect corresponding secondary electron beams 261, 262, and 263, respectively, and generate corresponding intensity signal outputs (not shown) to an image processing system (e.g., controller 50). In some embodiments, each detection element 241, 242, and 243 may comprise one or more pixels. The intensity signal output of a detection element may be a sum of signals generated by all the pixels within the detection element.

In some embodiments, controller 50 may comprise image processing system that includes an image acquirer (not shown), a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 240 of apparatus 40 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 240 and may construct an image. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time sequence. The multiple images may be stored in the storage. In some embodiments, controller 50 may be configured to perform image processing steps with the multiple images of the same location of sample 208.

In some embodiments, controller 50 may include measurement circuitries (e.g., analog-to-digital converters) to obtain a distribution of the detected secondary electrons. The electron distribution data collected during a detection time window, in combination with corresponding scan path data of primary electron beam 202 incident on the wafer surface, can be used to reconstruct images of the wafer structures under inspection. The reconstructed images can be used to reveal various features of the internal or external structures of sample 208, and thereby can be used to reveal any defects that may exist in the wafer.

In some embodiments, controller 50 may control motorized stage 209 to move sample 208 during inspection of sample 208. In some embodiments, controller 50 may enable motorized stage 209 to move sample 208 in a direction continuously at a constant speed. In other embodiments, controller 50 may enable motorized stage 209 to change the speed of the movement of sample 208 overtime depending on the steps of scanning process.

Although FIG. 2 shows that apparatus 40 uses three primary electron beamlets, it is appreciated that apparatus 40 may generate or use two or more number of primary electron beamlets. The present disclosure does not limit the number of primary electron beamlets used in apparatus 40.

Figure 3A:
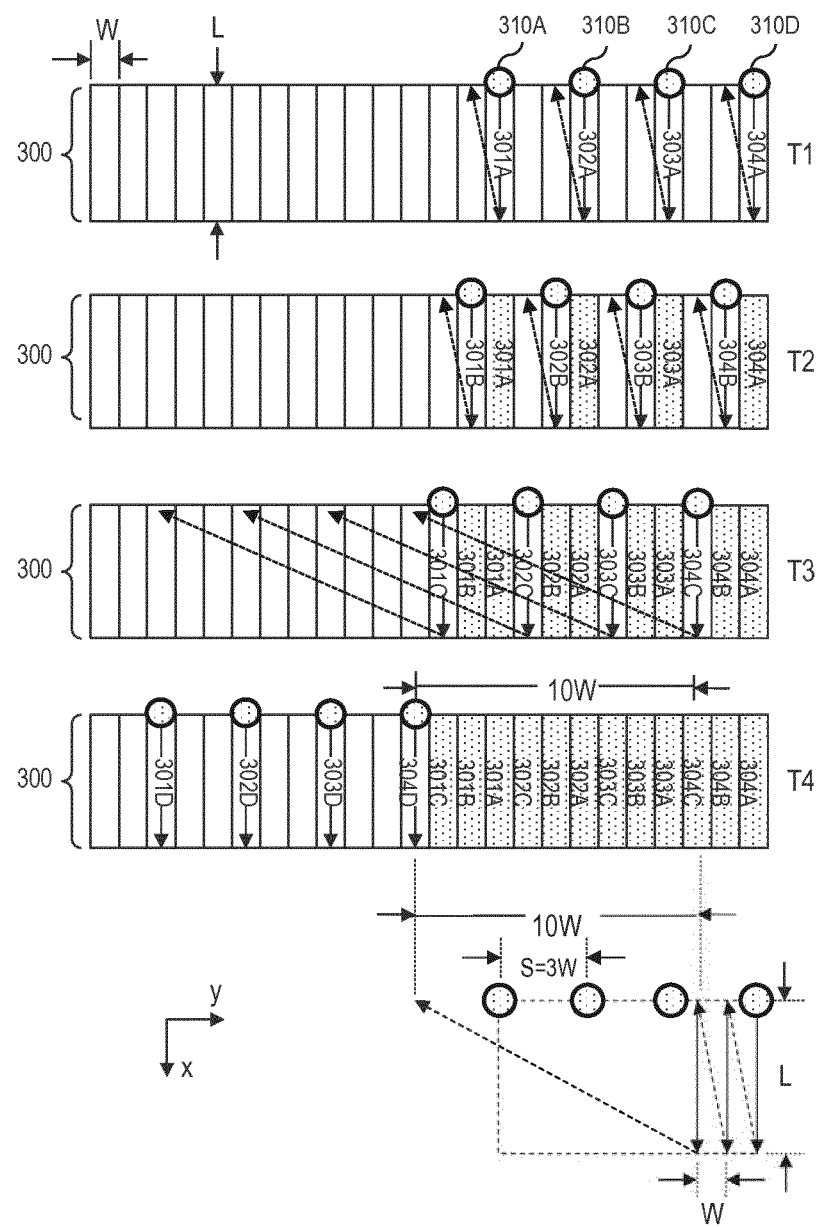
FIGS. 3A and 3B schematically shows inspecting a sample using multiple beams of charged particles.
Figure 3B:
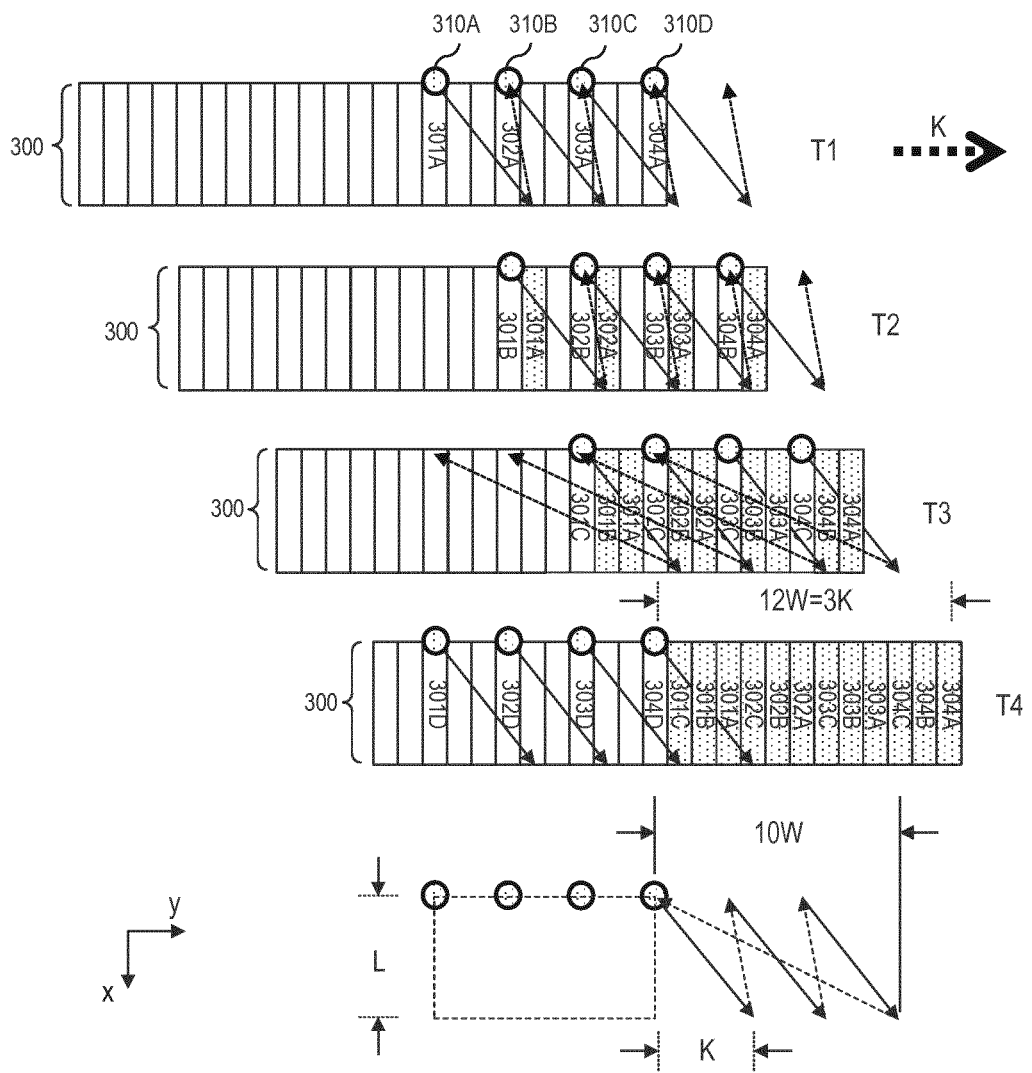

Reference is now made to FIGS. 3A and 3B, which schematically illustrate inspecting a sample using multiple beams of charged particles. In the embodiments illustrated by FIGS. 3A and 3B, four primary beamlets generate four probe spots 310A-310D on a sample (such as sample 208 in FIG. 2). FIG. 3A shows the movement of the four probe spots 310A-310D relative to the sample.

FIG. 3B shows the movements of the four probe spots 310A-310D and the sample relative to an absolute reference frame. The four probe spots 310A-310D may be, but not necessarily, arranged in a row. In the illustrated embodiment, the diameter of the four probe spots is W. However, in the disclosed embodiments, the diameter of the probe spots is not necessarily the same. The region 300 to be inspected is rectangular in shape but not necessarily so. For the convenience of explanation, two directions x and y are defined in the absolute reference frame. The x and y directions are mutually perpendicular.

In some embodiments, the movements of probe spots may be coordinated with the movement of the sample. For example, the four probe spots 310A-310D, relative to the sample, move by length L in the x direction without moving in the y direction during time period T1, as shown in FIG. 3A. Correspondingly, during the same time period T1, the sample moves in the y direction by length K relative to the absolute reference frame but does not move in the x direction relative to the absolute reference frame; and the four probe spots 310A-310D move by length K in the y direction relative to the absolute reference frame and move by length L in the x direction relative to the absolute reference frame, as shown in FIG. 3B. As such, during time period T1, the four probe spots 310A-310D move at the same speed as the sample in the y direction.

The moving direction of the probe spots 310A-310D during time period T1 does not have to be the same. The length by which the probe spots 310A-310D move during time period T1 does not have to be the same. The probe spots 310A-310D may or may not have movement relative to one another.

In the embodiments illustrated by FIGS. 3A and 3B, during time period T1, four sub-regions 301A, 302A, 303A, and 304A are inspected by the four probe spots 310A, 310B, 310C, and 310D, respectively. At the end of time period T1, the four probe spots 310A-310D move by length L in −x direction relative to the absolute reference frame and move by width W (i.e., width of the one of the four probe spots 310A-310D) in −y direction relative to the absolute reference frame. Therefore, relative to the sample, the four probe spots 310A-310D move to the −x ends of sub-regions 301B, 302B, 303B, and 304B, respectively, which may be adjoining sub-regions 301A, 302A, 303A, and 304A, respectively. This way, after reaching the last pixel of a scan line, each probe spot traverses back to the starting point of the next scan line. The adjacent scan lines may be separated by a distance corresponding to a pixel size of the images generated by the e-beam tool. The extra time required for the fly-back is called line overhead. In some cases, this fly-back may be quick enough such that the line overhead is negligible. Further, the line overhead may be included in time period T1.

During time periods T2 and T3, the four probe spots 310A-310D and the sample move in the same fashion, as during time period T1. This way, four sub-regions 301B, 302B, 303B, and 304B are inspected during T2, and four sub-regions 301C, 302C, 303C, and 304C are inspected by the four probe spots 310A-310D during T3.

At the end of time period T2, the four probe spots 310A-310D move in the same fashion as at the end of time period T1, to the −x ends of sub-regions 301C, 302C, 303C, and 304C, respectively. The sub-regions 301C, 302C, 303C, and 304C may be adjoining sub-regions 301B, 302B, 303B, and 304B, respectively.

In the embodiment illustrated by FIGS. 3A and 3B, the pitch S of the four probe spots 310A-310D in the y direction equals 3 W. Therefore, at the end of time period T3, the combination of the inspected sub-regions 301C, 301B, 301A, 302C, 302B, 302A, . . . , and 304A have no gap in the y direction. At the end of time period T3, the four probe spots 310A-310D may move by length L in −x direction relative to the absolute reference frame and move by 10 W in −y direction relative to the absolute reference frame. For example, at the end of time period T3, probe spot 310D needs to be moved from the +x end of sub-region 304C to the −x end of sub-region 304D. In effect, probe spot 310D moves by length L in −x direction and 10 W in −y direction, relative to the absolute reference frame. The movement of 10 W in −y direction may be achieved by deflecting the four primary beamlets in −y direction. Alternatively or additionally, such movement may be achieved by allowing the sample to move in y direction. Therefore, relative to the sample, the four probe spots 310A-310D move to the −x ends of sub-regions 301D, 302D, 303D, and 304D, respectively, among which sub-region 304D may be adjoining sub-region 301C. After this movement, the four probe spots 310A-310D are at the same locations relative to the absolute reference frame, as at the beginning of time period T1. Additional sub-regions (e.g., 301D, 302D, 303D, 304D, etc.) may be inspected by the four probe spots 310A-310D during additional time periods (e.g., time period T4.)

During time periods T1-T3, the sample moves by 3K (see FIG. 3B) in the y direction relative to the absolute reference frame; the four probe spots 310A-310D move by zero in the y direction relative to the absolute reference frame; the four probe spots 310A-310D move by 12 W in the −y direction relative to the sample. Therefore, 3 K equals 12 W, i.e., K equals 4 W. The speed of the sample during time periods T1-T3 may remain constant.

To generalize, when the number of probe spots is M, and the pitch of the probe spots in the x direction is S=NW, where N is an integer equal to or greater than 2, the number of time periods needed for the combination of inspected sub-regions to have no gaps in the x direction is N and the distance K travelled by the sample during each of the time period equals MW. In the example of FIGS. 3A and 3B, N=3, M=4 and K=4 W.

Figure 3C:
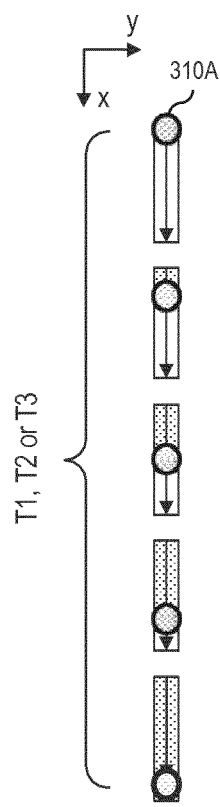
FIGS. 3C and 3D schematically shows the movement of one of the probe spots in FIGS. 3A and 3B relative to the sample during one of time periods T1, T2, and T3.
Figure 3D:
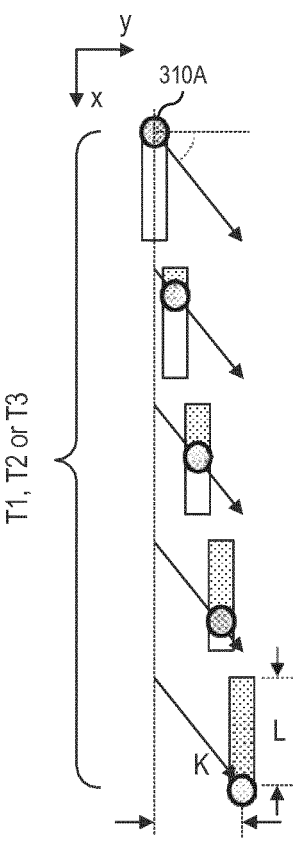

FIG. 3C schematically shows the movement of one of the probe spots 310A-310D relative to the sample during one of time periods T1, T2, and T3. Relative to the sample, the probe spot moves only in the x direction by distance L during this time period but does not move in the y direction. FIG. 3D schematically shows the movement of the probe spot relative to the absolute reference frame during that time period. Relative to the absolute reference frame, the probe spot moves in the x direction by distance L and in the y direction by distance K during this time period. Relative to the absolute reference frame, the movement direction of the probe spot and the movement direction of the sample has an angle θ=arctan(L/K).

The above-described embodiments require that probe spots 310A-310D make a "jump" of 10 W in −y direction relative to the absolute reference frame, at the end of time period T3. However, in some embodiments, no such jump is performed at the end of time period T3. Instead, the four probe spots 310A-310D continuously move in the same fashion as at the end of time periods T1 and T2, to the ends of the next adjoining sub-regions. Specifically, referring to FIG. 3A, at the end of time period T3, probe spot 310D moves to the −x end of sub-region 303A, which had been previously scanned by probe spot 310C; probe spot 310C moves to the −x end of sub-region 302A, which had been previously scanned by probe spot 310B; probe spot 310B moves to the −x end of sub-region 301A, which had been previously scanned by probe spot 310A; and probe spot 310A moves to the −x end of sub-region 304D, which adjoins sub-region 301C. This way, each of the four probe spots 310A-310D will separately inspect the same sub-regions. That is, some sub-regions may be scanned four times by the primary beamlets. Therefore, the generated signals may be used to perform frame averaging, so as to improve the signal-noise ratio of the constructed sample image.

Figure 4A:
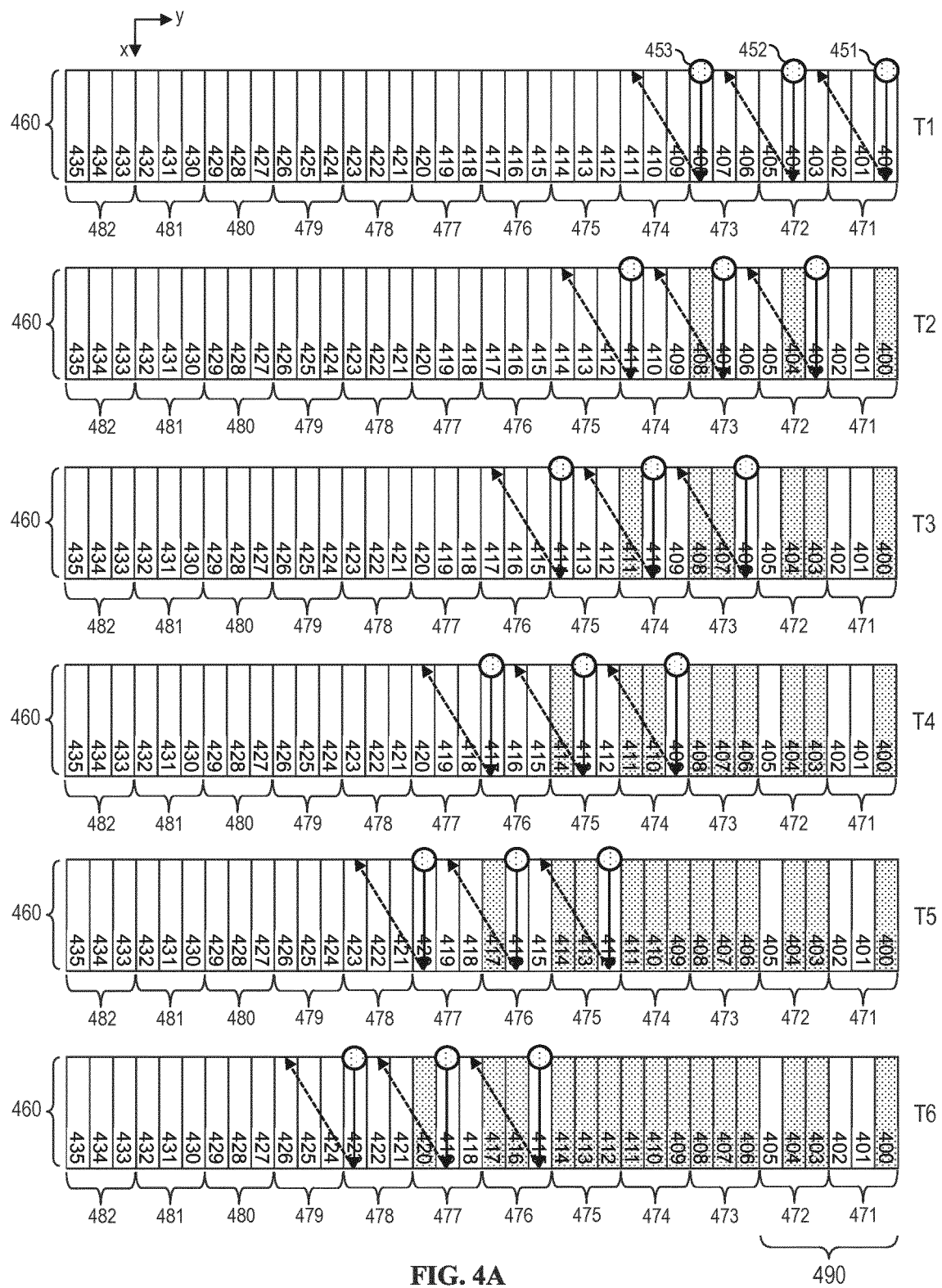
FIGS. 4A and 4B schematically shows inspecting a sample using multiple beams of charged particles, consistent with embodiments of the present disclosure.
Figure 4B:
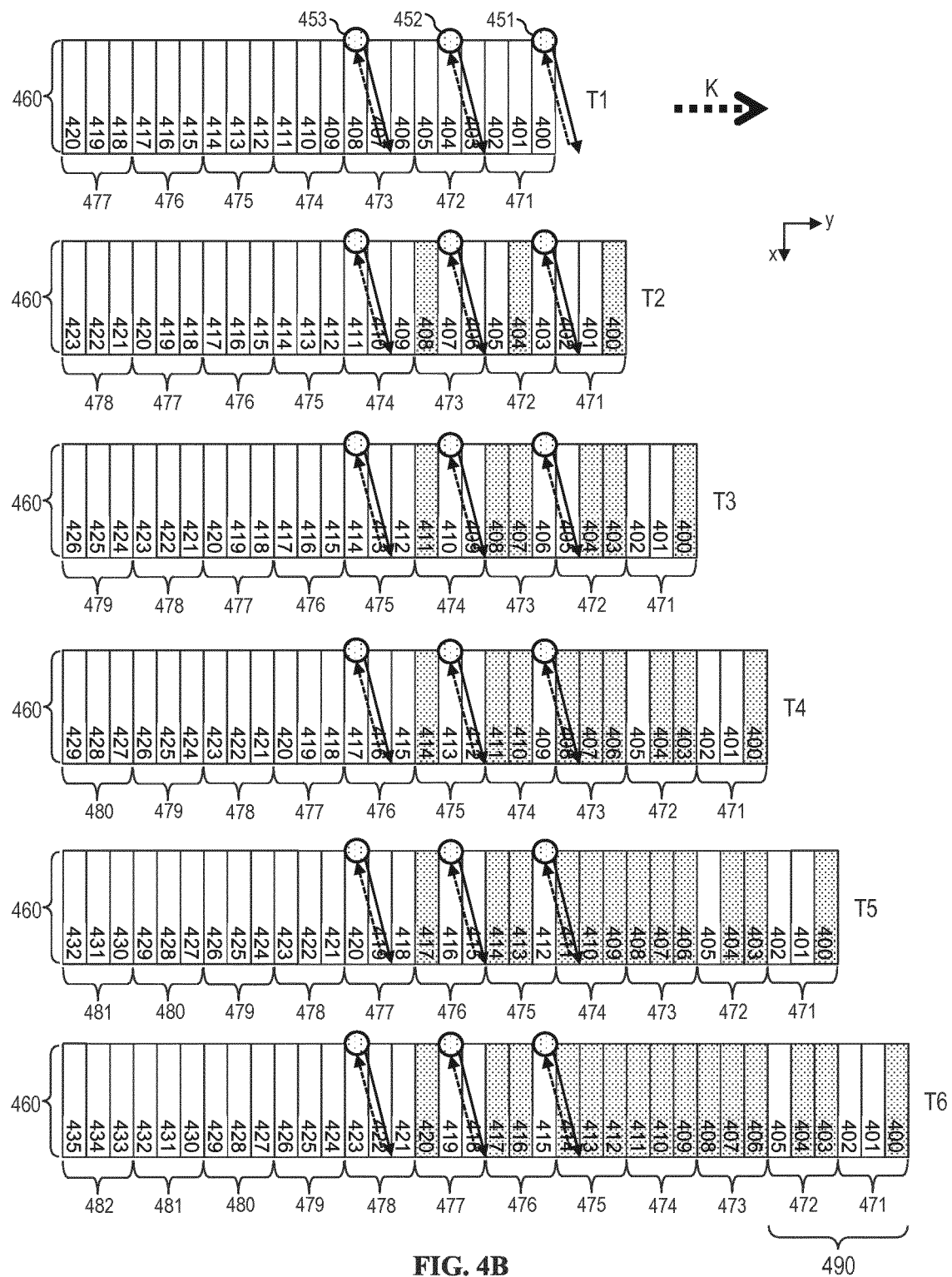

Reference is now made to FIGS. 4A and 4B, which schematically illustrate inspecting a sample using multiple beams of charged particles, according to exemplary embodiments of the present disclosure. In the embodiments illustrated by FIGS. 4A and 4B, three primary beamlets may generate three probe spots 451, 452, and 453 on a sample (such as sample 208 in FIG. 2). FIG. 4A shows the movement of three probe spots 451, 452, 453 relative to the sample. FIG. 4B shows the movements of three probe spots 451, 452, 453 and the sample relative to an absolute reference frame. Three probe spots 451, 452, 453 may be, but not necessarily, arranged in a row. For the convenience of explanation, two directions x and y are defined in the absolute reference frame. The x and y directions are mutually perpendicular.

In some embodiments, scan area 460 of the sample to be inspected is rectangular in shape but not necessarily so. Scan area 460 of the sample may be divided to a plurality of scan lines 400, 401, 402, . . . , 434, and 435. The width of a scan line may match or be substantially similar to the width of a probe spot. In such embodiments, a scan line may be scanned and inspected by a probe spot. Although FIG. 4A shows thirty-six scan lines (scan lines 400-435), it is appreciated that scan area 460 may include any number of scan lines depending on the size of scan area 460 and the width of a probe spot.

In some embodiments, every three consecutive scan lines may be grouped together and form a scan section. For example, the first three scan lines 400, 401, 402 may form scan section 471; the next three scan lines 403, 404, 405 may form scan section 472; the next three scan lines 406, 407, 408 may form scan section 473; and so on. In some embodiments, three probe spots 451, 452, 453 may be arranged so that each probe spot may scan only the corresponding scan lines of the scan sections. For example, as shown in FIG. 4A, probe spot 451 may be configured to scan the first scan lines (the rightmost) in the scan sections; probe spot 452 may be configured to scan the second scan lines (the middle) in the scan sections; and probe spot 453 may be configured to scan the third scan lines (the leftmost) in the scan sections. Accordingly, in such embodiments, probe spot 451 may scan 400, 403, 406, . . . , 415 during time periods T1, T2, T3, . . . , T6, and so on, respectively; probe spot 452 may scan 404, 407, 410, . . . , 423 during time periods T1, T2, T3, . . . , T6, and so on, respectively; and probe spot 453 may scan 408, 411, 414, . . . , 423 during time periods T1, T2, T3, . . . , T6, and so on, respectively. Although FIGS. 4A and 4B illustrate the movements of probe spots and sample during the first six time periods (T1-T6), it is appreciated that the sequence may continue until the sample is fully scanned and inspected.

In some embodiments, during each time period, the sample may move in the y direction by length K relative to the absolute reference frame while probe spots 451, 452, and 453 scan the scan lines. In such embodiments, the sample may not move in the x direction relative to the absolute reference frame. Correspondingly, during each time period, probe spots 451, 452, and 453 may move in the x direction to scan the scan lines while also moving in the y direction at the same speed (e.g., speed K) as the sample, thereby following the movement of the sample while scanning the scan lines. And, after the scanning is completed, probe spots 451, 452, and 453 may retrace back in the −x direction and in the −y direction to the starting points of the next set of scan lines. In other embodiments, during each time period, probe spots 451, 452, and 453 may only move relative to the absolute reference frame in the x direction but not in the y direction. Accordingly, in such embodiment, the scan lines may be tilted away from the sample moving direction (i.e., not perpendicular to y direction) relative to the sample to accommodate the sample movement.

For example, as shown in FIG. 4B, the sample may move by 3 W (i.e., the width of a scan section) per time period (i.e., K=3 W per time period), thereby providing a new scan section to a probe spot in each time period. In such embodiments, during the first half of time period T1, probe spots 451, 452, 453 may move in x direction to scan scan lines 400, 404, 408, respectively, while also moving in the y direction by 1.5 W. After scanning is completed, during the second half of time period T1, probe spots 451, 452, and 453 may move back in the −x direction while also moving in the −y direction by 1.5 W to the starting points of the next set of scan lines (e.g. 403, 407, and 411). This way, after reaching the last pixel of a scan line, each probe spot traverses back to the starting point of the next scan line. During the following time periods, (e.g., T2, T3, . . . ), probe spot 451, 452, 453 and the sample may move in the same fashion repeatedly, as during time period T1. Accordingly, scan lines 403, 407, and 411 may be scanned during time period T2; scan lines 406, 410, 414 may be scanned during time period T3, and so on.

In contrast to the embodiments described with respect to FIGS. 3A and 3B, where the probe spots need to make a "jump" in −y direction at the end of time period T3, no such "jump" needs to be performed in the embodiments shown in FIGS. 4A and 4B as each probe spot scans only the corresponding set of scan lines of the scan sections. Instead of making the "jump," probe spots 451, 452, and 453 may continuously repeat the above-described movement to scan scan lines while the sample is moving.

In general terms, the speed K of sample movement may be determined as follows:

$$K = MW/\text{time period},\qquad\text{Equation (1)}$$

where M is the number of probe spots and W is the width of a probe spot. Furthermore, the pitch S of the probe spots may be determined as follows:

$$S = (nM+1) \times W,\qquad\text{Equation (2)}$$

where n is an integer equal to or greater than 2. In the example of FIGS. 4A and 4B, the number of probe spots is 3 (i.e., M=3) and n=1, thereby resulting in K=3 W per time period and S=4 W. Although FIGS. 4A and 4B illustrate an exemplary embodiment using three probe spots (i.e., M=3), it is appreciated that any number of probe spots may be used to scan the sample.

In some embodiments, some scan lines in the first two scan sections (e.g., scan sections 471 and 472) may not be scanned by the above-described scanning sequence. Therefore, in some embodiments, scan area 460 may need to include a buffer area 490 that are not required to be inspected. In such embodiments, aside from the scan lines in buffer area 490, all scan lines (e.g., scan lines 406, 407, 408, 409, . . . , and so on) may be scanned continuously without any gap. Although only one buffer area (e.g. buffer area 490) is illustrated in FIGS. 4A and 4B, it is appreciated that scan area 460 may include more than one buffer areas. For example, another buffer area (not shown) may be included at the end of scan area 460 (e.g., the leftmost scan sections).

Figure 5A:
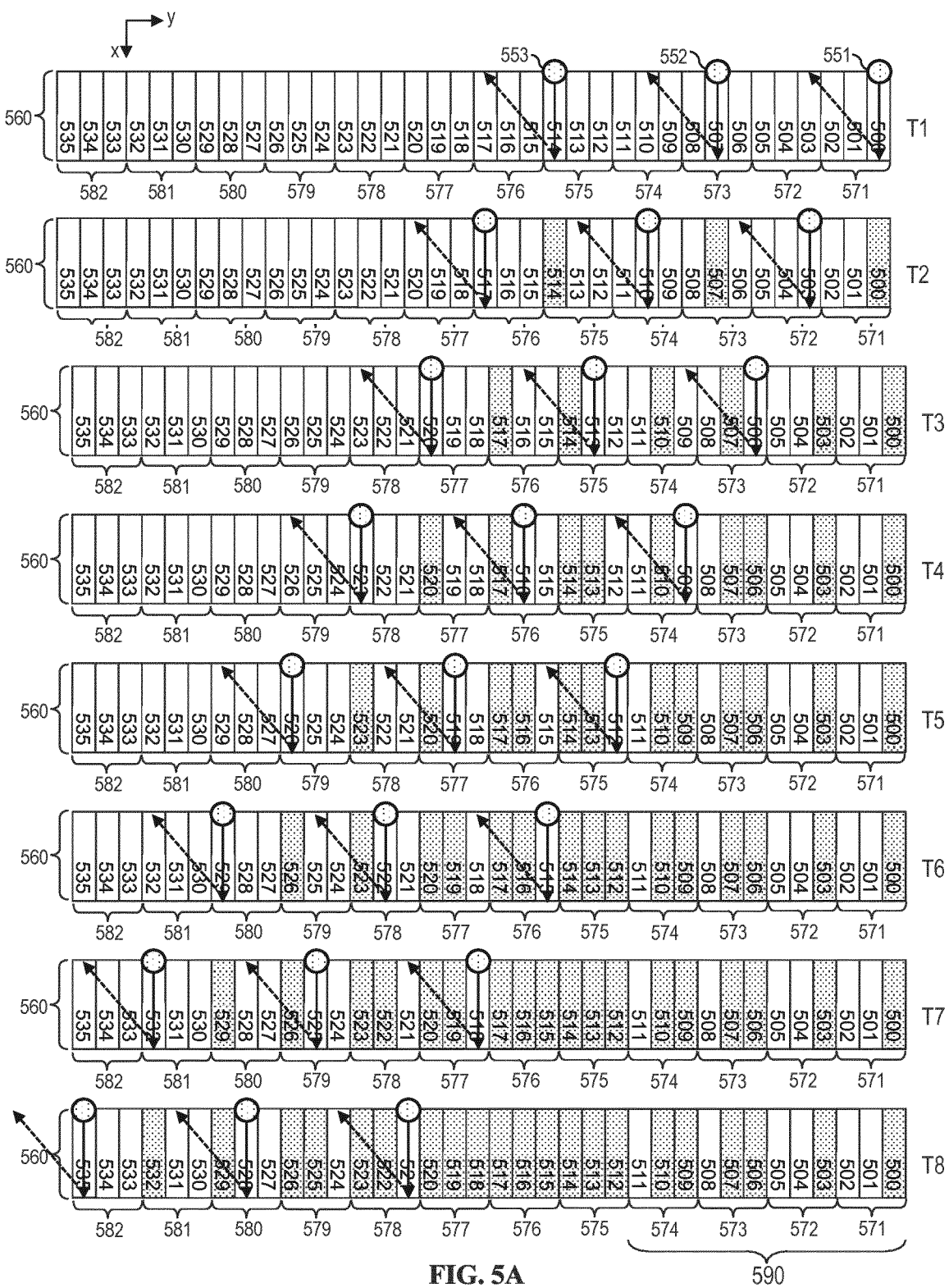
FIGS. 5A and 5B schematically shows inspecting a sample using multiple beams of charged particles, consistent with embodiments of the present disclosure.
Figure 5B:
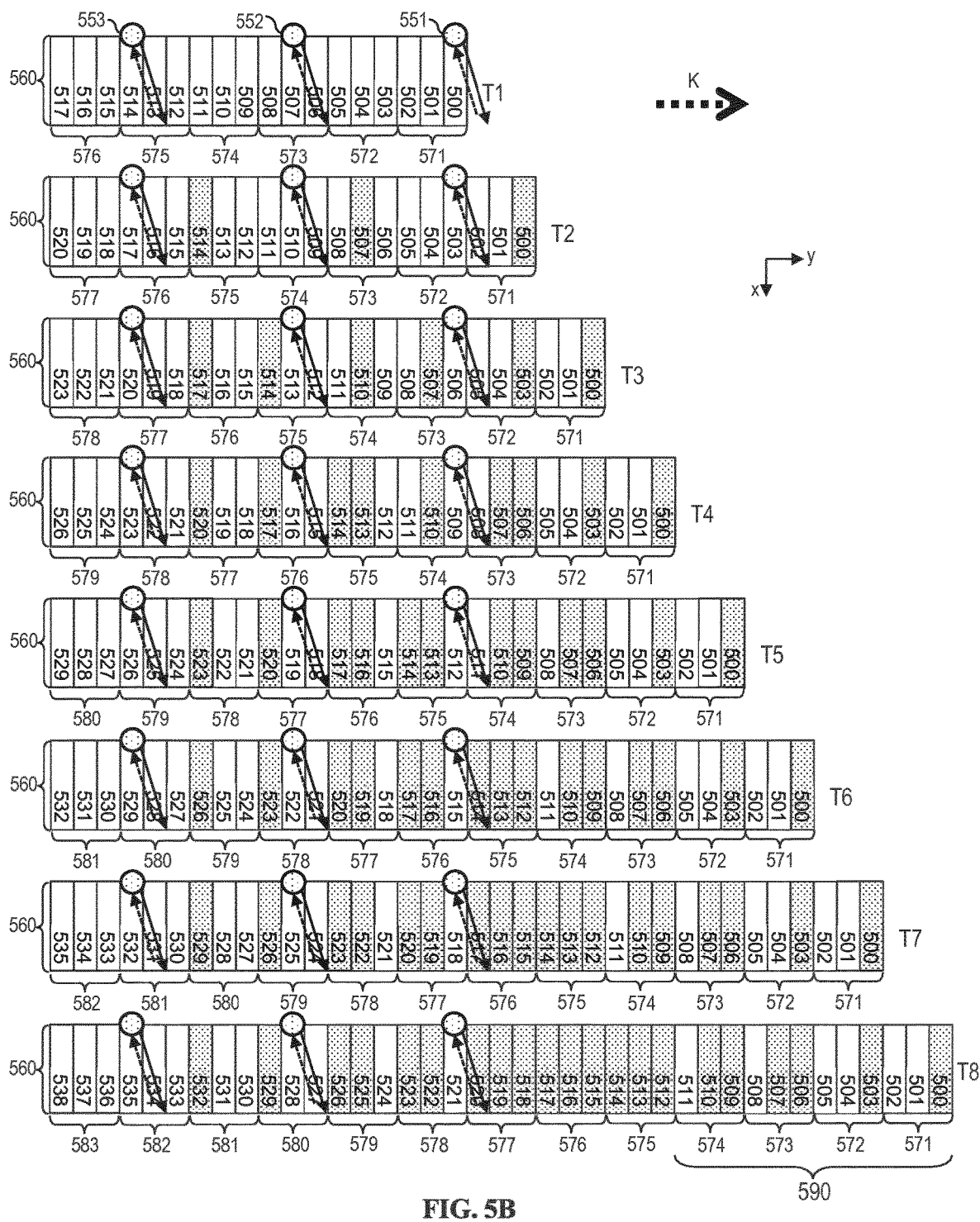

Reference is now made to FIGS. 5A and 5B, which schematically illustrate inspecting a sample using multiple beams of charged particles, according to exemplary embodiments of the present disclosure. FIGS. 5A and 5B show an embodiment with the same scanning configuration as in FIGS. 4A and 4B, except that the pitch S of the probe spots (e.g., the distance between probe spot 551 and probe spot 552 in FIG. 5A) is larger in the embodiments shown in FIGS. 5A and 5B.

Similar to FIG. 4A, scan area 560 of the sample may be divided to a plurality of scan lines 500, 501, 502, . . . , 534, and 535. The width of a scan line may match or substantially similar to the width of a probe spot. In such embodiments, a scan line may be scanned and inspected by a probe spot. Although FIG. 5A shows thirty-six scan lines (scan lines 500-535), it is appreciated that scan area 560 may include any number of scan lines depending on the size of scan area 560 and the width of a probe spot.

In some embodiments, every three consecutive scan lines may be grouped together and form a scan section. For example, the first three scan lines 500, 501, 502 may form scan section 571; the next three scan lines 503, 504, 505 may form scan section 572; and so on. In some embodiments, three probe spots 551, 552, 553 may be arranged so that each probe spot may scan only the corresponding scan lines of the scan sections. For example, as shown in FIG. 5A, probe spot 551 may be configured to scan the first scan lines (the rightmost) in the scan sections; probe spot 552 may be configured to scan the second scan lines (the middle) in the scan sections; and probe spot 553 may be configured to scan the third scan lines (the leftmost) in the scan sections. Accordingly, in such embodiments, probe spot 551 may scan 500, 503, 506, . . . , 521 during time periods T1, T2, T3, . . . , T8, and so on, respectively; probe spot 552 may scan 507, 510, 513, . . . , 528 during time periods T1, T2, T3, . . . , T8, and so on, respectively; and probe spot 553 may scan 514, 517, 520, . . . , 535 during time periods T1, T2, T3, . . . , T8, and so on, respectively. Although FIGS. 5A and 5B illustrate the movements of probe spots and sample during the first eight time periods (T1-T8), it is appreciated that the sequence may continue until the sample is fully scanned and inspected.

Similar to the embodiments shown in FIGS. 4A and 4B, during each time period, the sample may move in the y direction by length K relative to the absolute reference frame while probe spots 551, 552, and 553 scan the scan lines. In such embodiments, the sample may not move in the x direction relative to the absolute reference frame. Correspondingly, during each time period, probe spots 551, 552, and 553 may move in the x direction to scan the scan lines while also moving in the y direction at the same speed (e.g., speed K) as the sample, thereby following the movement of the sample while scanning the scan lines. And, after the scanning is completed, probe spots 551, 552, and 553 may retrace back in the −x direction and in the −y direction to the starting points of the next set of scan lines.

For example, as shown in FIG. 5B, the sample may move by 3 W (i.e., the width of a scan section) per time periods (i.e., K=3 W per time period), thereby providing a new scan section to a probe spot in each time period. In such embodiments, during the first half of time period T1, three probe spots 551, 552, 553 may move in x direction to scan scan lines 500, 507, 514, respectively, while also moving in the y direction by 1.5 W. After scanning is completed, during the second half of time period T1, probe spots 551, 552, and 553 may move back in the −x direction while also moving in the −y direction by 1.5 W to the starting points of the next set of scan lines (e.g. 503, 510, and 517). This way, after reaching the last pixel of a scan line, each probe spot traverses back to the starting point of the next scan line. During the following time periods, (e.g., T2, T3, . . . ), probe spot 551, 552, 553 and the sample may move in the same fashion repeatedly, as during time period T1. Accordingly, scan scan lines 503, 510, and 517 may be scanned during time period T2; scan lines 506, 513, 520 may be scanned during time period T3, and so on.

Similar to the embodiments described with respect to FIGS. 4A and 4B, no "jump" needs to be performed in the embodiments shown in FIGS. 5A and 5B as each probe spot scans only the corresponding set of scan lines of the scan sections. Instead of making the "jump," probe spots 551, 552, and 553 may continuously repeat the above-described movement to scan scan lines while the sample is moving.

As described with respect to FIGS. 4A and 4B, the speed K of sample movement may be determined as follows:

$$K = MW/\text{time period},\qquad\text{Equation (3)}$$

where M is the number of probe spots and W is the width of a probe spot. Furthermore, the pitch S of the probe spots may be determined as follows:

$$S = (nM+1) \times W,\qquad\text{Equation (4)}$$

where n is an integer equal to or greater than 2.

FIGS. 5A and 5B illustrate an embodiment where the number of probe spots is 3 (i.e., M=3) and n=2. Thus, the speed K equals 3 W per time period, and the pitch S equals 7 W.

In some embodiments, some scan lines in the first four scan sections (e.g., scan sections 571, 572, 573, and 574) may not be scanned by the above-described scanning sequence. Therefore, in some embodiments, scan area 560 may need to include a buffer area 590 that are not required to be inspected. In such embodiments, aside from the scan lines in buffer area 590, all scan lines (e.g., scan lines 512, 513, 514, 515, . . . , and so on) may be scanned continuously without any gap. Although only one buffer area (e.g. buffer area 590) is illustrated in FIGS. 5A and 5B, it is appreciated that scan area 560 may include more than one buffer area. For example, another buffer area (not shown) may be included at the end of scan area 560 (e.g., the leftmost scan sections).

Figure 6:
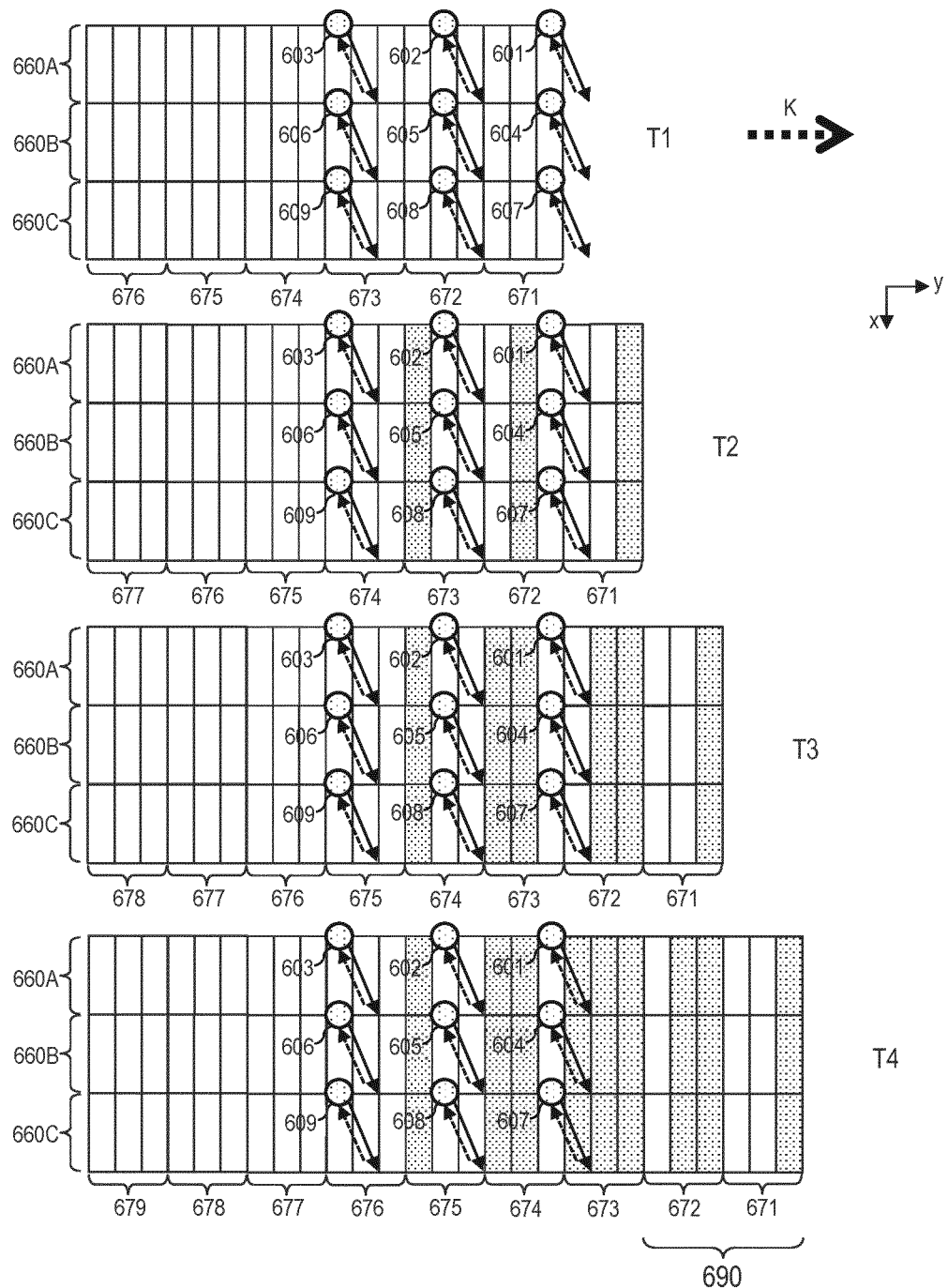
FIG. 6 schematically shows inspecting a sample using multiple beams of charged particles, consistent with embodiments of the present disclosure.

Reference is now made to FIG. 6, which schematically illustrates inspecting a sample using multiple beams of charged particles, according to exemplary embodiments of the present disclosure. Although FIGS. 4A, 4B, 5A, and 5B show that the three probe spots (e.g., probe spots 451, 452, 453 in FIGS. 4A and 4B, and probe spots 551, 552, 553 in FIGS. 5A and 5B) are aligned in a line along the moving direction of a sample (such as sample 208 of FIG. 2), the probe spots, and thus the primary beamlets, may have other spatial arrangements. In some embodiments, the multiple primary beamlets may be arranged in a matrix. For example, as shown in FIG. 6, nine probe spots 601, 602, . . . , 609 may be arranged in a 3×3 matrix configuration. In such embodiments, the first row of probe spots (601, 602, 603) may scan a first scan area 660A. Similarly, the second row (604, 605, 606) and the third row (607, 608, 609) may scan a second scan area 660B and a third scan area 660C, respectively. While FIG. 6 shows that adjacent rows of probe spots scan adjacent scan areas, it is appreciated that adjacent rows of probe spots can scan non-adjacent scan areas. For example, the first row of probe spots (601, 602, 603) may scan first scan area 660A, while the second row of probe spots (604, 605, 606) could scan the third scan area 660C.

Similar to the embodiments shown above, the sample including scan areas 660A, 660B, and 660C may constantly move in the y direction at a speed of K relative to the absolute reference frame while the scan lines in scan areas 660A, 660B, and 660C are scanned simultaneously by three rows of probe spots. In such embodiments, each scan area (e.g., 660A, 660B, or 660C) may be scanned in the same fashion as described with respect to FIGS. 4A and 4B.

As described with respect to FIGS. 4A, and 4B, some scan lines in the first two scan sections (e.g., scan sections 671 and 672) may not be scanned by the above-described scanning sequence. Therefore, in some embodiments, scan areas 660A, 660B, and 660C may need to include a buffer area 690 that are not required to be inspected. In such embodiments, aside from the scan lines in buffer area 690, all scan lines (e.g., scan lines in the scan sections 673, 674, 675, . . . , and so on) may be scanned continuously without any gap. Although only one buffer area (e.g. buffer area 690) is illustrated in FIG. 6, it is appreciated that scan areas 660A, 660B, and 660C may include more than one buffer areas. For example, another buffer area (not shown) may be included at the end of scan areas 660A, 660B, and 660C (e.g., the leftmost scan sections).

Although FIG. 6 illustrates a configuration of the primary beamlets with nine probe spots 601-609 arranged in a 3×3 matrix, it is appreciated that the principle disclosed herein may be applied to any number and configuration of primary beamlets, such as primary beamlets arranged in a 3×2, 4×4, 5×5, 3×5, 8×5, 20×20, or any size of matrix configuration.

Figure 7:
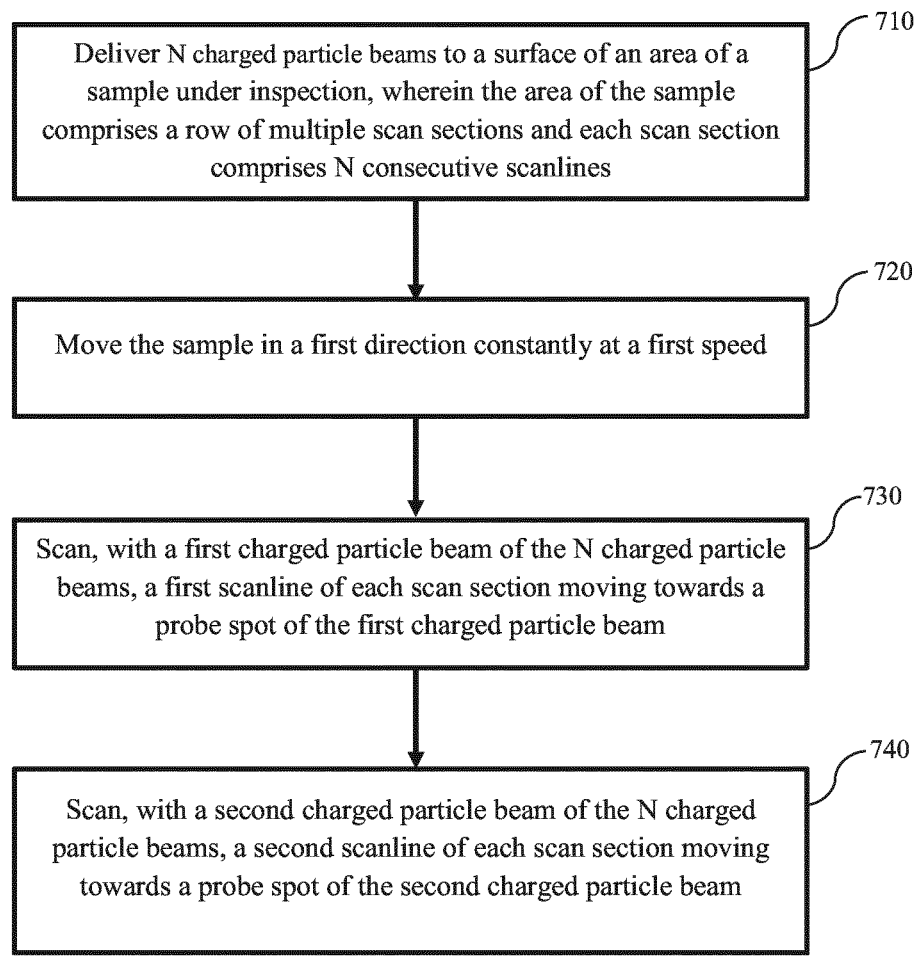
FIG. 7 is a flow chart illustrating steps of an exemplary multi-beam scanning method, consistent with embodiments of the present disclosure.

Reference is now made to FIG. 7, which is a flow chart illustrating steps of an exemplary multi-beam scanning method, consistent with embodiments of the present disclosure. The method may be performed by a multi-beam electron beam tool (such as electron beam tool 40 of FIG. 1).

In step 710, the multi-beam electron beam tool delivers N charged particle beamlets to a surface of an area of a sample (such as sample 208 in FIG. 2) under inspection, wherein the N charged particle beamlets generate N probe spots (such as probe spots 451, 452, and 453 in FIG. 4A) on the sample. In some embodiments, the scan area of the sample may be divided into a plurality of scan lines (such as scan lines 400, 401, 402, . . . , 435 in FIG. 4A), and every N consecutive scan lines may be grouped together and form a scan section. For example, as shown in FIG. 4A, where three probe spots are used, the first three scan lines 400, 401, 402 may form scan section 471; the next three scan lines 403, 404, 405 may form scan section 472; and so on.

In step 720, the multi-beam electron beam tool controls a motorized sample stage (such as motorized stage 209 of FIG. 2) to move the sample in a first direction while the sample is being scanned and inspected. In some embodiments, the sample may move at a constant speed continuously. In other embodiments, the speed of sample movement may change overtime depending on the steps of scanning process. It is appreciated that step 720 may precede step 710 or that the performance of steps 710 and 720 may be started concurrently.

In steps 730 and 740, the multi-beam electron beam tool deflects the N charged particle beamlets to move the N probe spots on the surface of the sample to scan the scan lines. For example, during each time period, the multi-beam electron beam tool moves the N probe spots in a second direction (such the x direction of FIGS. 4A and 4B) to scan the scan lines while also moving in the first direction (i.e., the moving direction of the sample, such as the y direction of FIGS. 4A and 4B) at the same speed (e.g., speed K) as the sample, thereby following the movement of the sample while scanning the scan lines. And, after the scanning is completed, the N probe spots may retrace back to the starting points of the next set of scan lines.

In some embodiments, the N probe spots are arranged so that each probe spot may scan the corresponding scan lines of the scan sections. For example, a first probe spot (such as probe spot 451 of FIG. 4A) may be configured to scan only the first scan lines of the scan sections, a second probe spot (such as probe spot 452 of FIG. 4A) may be configured to scan only the second scan lines of the scan sections, and similarly, a $N^{th}$ probe spot may be configured to scan only the $N^{th}$ scan lines of the scan sections. This way, the multi-beam electron beam tool does not need to make a big "jump" movement as each probe spot scans only corresponding set of scan lines without much, if any, overlap. Instead of making a "jump," N probe spots may continuously repeat the above-described movements along scan lines of the sample while the sample is moving in the first direction.

Figure 8A:
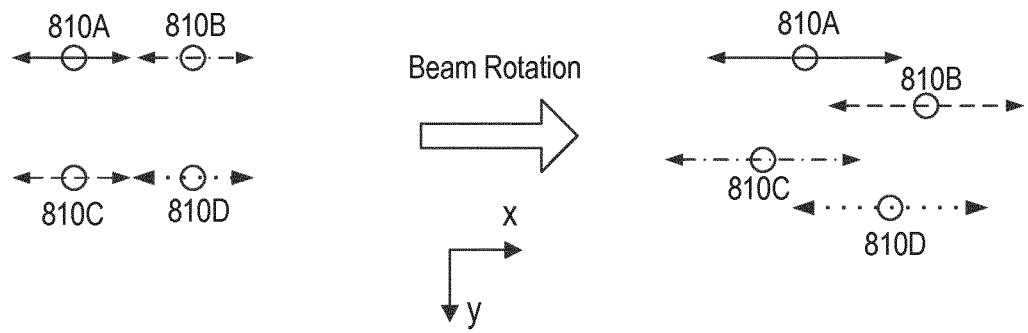
FIG. 8A is a schematic diagram illustrating a distribution of multiple primary beamlets on a surface of a sample before and after a rotation of the primary beamlets around an optical axis of the e-beam inspection system shown in FIG. 1, consistent with embodiments of the present disclosure.
Figure 8B:
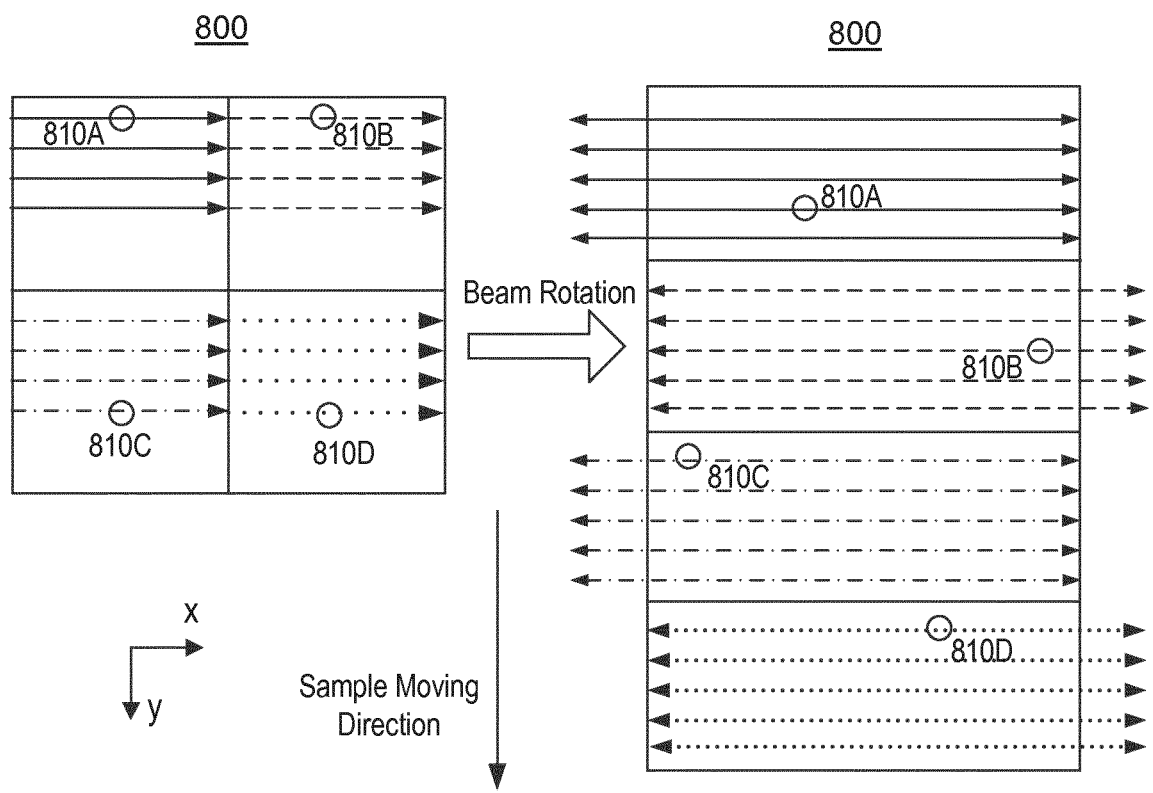
FIG. 8B is a schematic diagram illustrating a scanning pattern of multiple primary beamlets on a surface of a sample before and after a rotation of the primary beamlets around an optical axis of the e-beam inspection system shown in FIG. 1, consistent with embodiments of the present disclosure

Although FIGS. 3A and 3B show that the four probe spots 310A-310D align in a line along the moving direction of sample, the probe spots and thus the primary beamlets may have other spatial arrangements. For example, the multiple primary beamlets may be arranged in a matrix, as shown in FIGS. 8A and 8B. FIG. 8A is a schematic diagram illustrating a distribution of multiple primary beamlets (e.g., primary beamlets 211, 212, and 213 of FIG. 2) on a surface of a sample before and after a rotation of the primary beamlets around an optical axis (e.g., primary optical axis 204 of FIG. 2), consistent with embodiments of the present disclosure. FIG. 8B is a schematic diagram illustrating a scanning pattern of the multiple primary beamlets on the surface of the sample before and after the rotation, consistent with embodiments of the present disclosure. Although FIGS. 8A and 8B show four probe spots (or primary beamlets) arranged in a 2×2 matrix, it is contemplated that the principle disclosed herein may be applied to any number of primary beamlets, such as primary beamlets arranged in a 3×3, 4×5, 5×5, or 20×20 matrix.

Referring to FIGS. 8A and 8B, four probe spots 810A-810D may be initially arranged in a 2×2 matrix, with each column of the matrix being along a moving direction of the sample (see left sides of FIGS. 8A and 8B). Each of the probe spots 810A-810D may perform an x-y scan of a part of a region 800 on the sample, in a manner similar to that illustrated in FIGS. 3A-3D. Consistent with the disclosed embodiments, the four probe spots 810A-810D may be rotated relative to the sample, such that each of the four probe spots 810A-810D may move on non-overlapping scan lines (see right sides of FIGS. 8A and 8B). The adjacent scan lines may be separated by a distance corresponding to a pixel size of the images generated by the e-beam tool. This rotation may be achieved by, but not limited to, controlling deflection scanning unit 232 of FIG. 2 to rotate the primary beamlets, rearranging the array of image-forming elements in e-beam tool 40, or rotating the sample. After the rotation, each of the probe spots 810A-810D may move on a longer scan line without overlapping. Because the time for a probe spot to switch a scan line is fixed, the time overhead associated with each scan line may be lowered and the overall throughput of e-beam tool 40 may be improved.

As illustrated by the right side of FIG. 8B, after beam rotation, the four probe spots 810A-810D are no longer aligned along the sample moving direction. Thus, the actual area scanned by the four probe spots 810A-810D (the areas covered by the scan lines) is made larger than the e-beam tools field of view. Specifically, in FIG. 8B, area 800 is the area imaged by the e-beam tool. Each of the scan lines, 1, 2, 3, 4, . . . , is longer than the width of the area 800, such that all the scan lines collectively can cover area 800.

Figure 9:
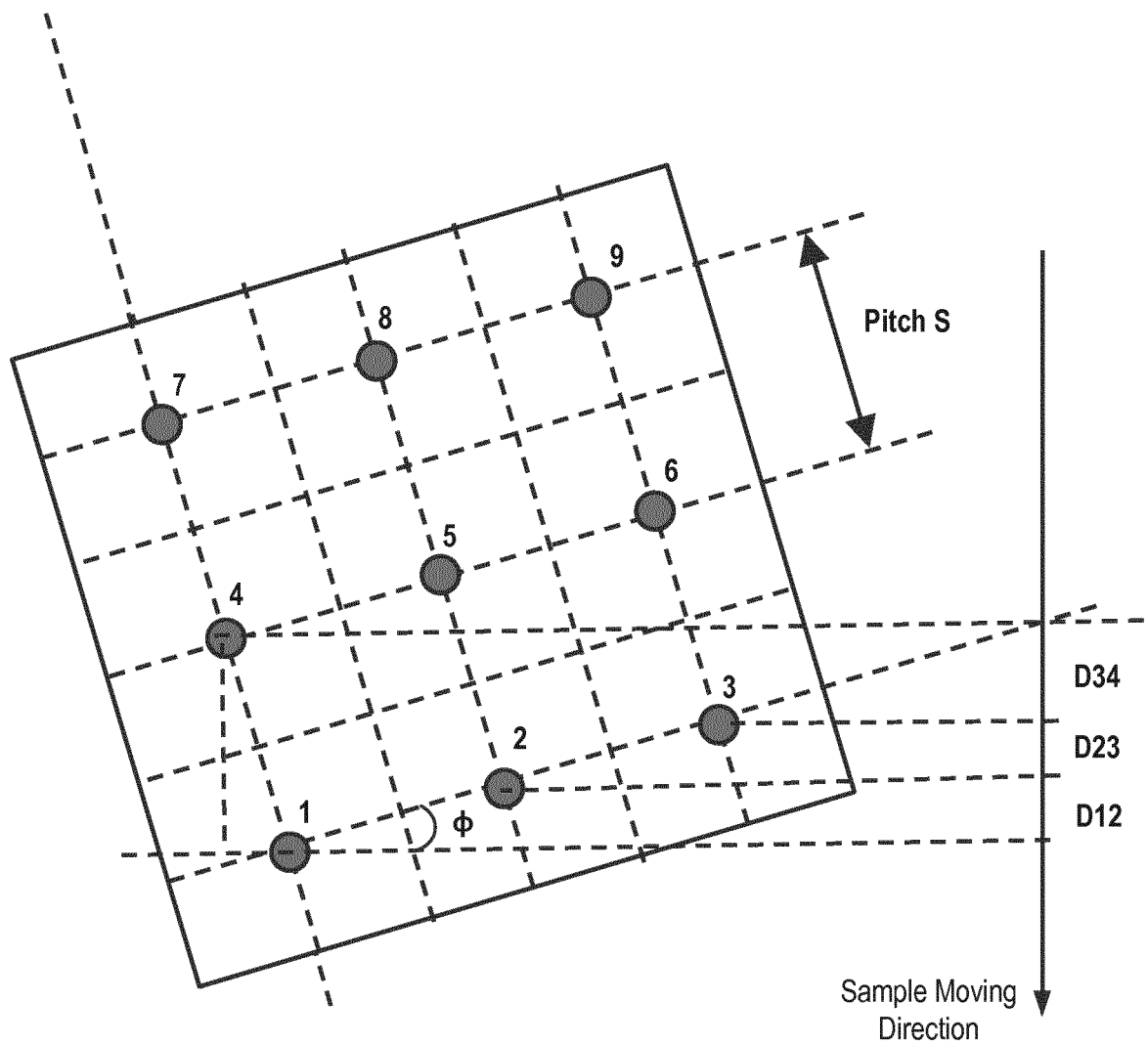
FIG. 9 is a schematic diagram illustrating a process for selecting a rotation angle for the primary beamlets shown in FIGS. 8A and 8B, consistent with embodiments of the present disclosure.

FIG. 9 is a schematic diagram illustrating a method of selecting a rotation angle for the rotation process shown in FIGS. 8A and 8B, consistent with embodiments of the present disclosure. For illustrative purpose only, FIG. 9 shows nine probe spots 1, 2, 3, 4, . . . , 9, arranged in a matrix. Before the rotation occurs, the probe spots have a pitch size S along the moving direction of the sample. After the pattern of the probe spots is rotated by an angle, the beam distances D along the moving direction have the following relationships:

$$D_{12}=D_{23}=D_{45}=D_{56}=D_{78}=D_{89}=S \sin \varphi \quad \text{Equation (5)}$$

$$D_{34}=D_{67}=S \cos \varphi - 2S \sin \varphi \quad \text{Equation (6)}$$

Consistent with the disclosed embodiment, one rotation angle φ can make the probe spots have the same beam distances D along the moving direction, i.e.:

$$D_{12}=D_{34} \quad \text{Equation (7)}$$

The above Equations (5)-(7) lead to:

$$S \cos \varphi - 2S \sin \varphi = S \sin \varphi \quad \text{Equation (8)}$$

Thus, $$\varphi = \tan^{-1}\frac{1}{3} = 18.43495° \quad \text{Equation (9)}$$

To generalize the above calculation to probe spots (i.e., primary beamlets) arranged in an M×N matrix (i.e., a matrix having M rows and N columns, and the columns of the matrix being initially aligned with the moving direction of the sample), the beam distances D along the moving direction should satisfy:

$$D_{1,2}=D_{N,N+1} \quad \text{Equation (10)}$$

And the rotation angle should satisfy:

$$S \cos \varphi - (N-1)S \sin \varphi = S \sin \varphi \quad \text{Equation (11)}$$

Thus, the proper rotation angle φ is:

$$\varphi = \tan^{-1}\frac{1}{N}, \quad \text{Equation (12)}$$

where N is the number of columns in the pattern (e.g., matrix) formed by the probe spots, or the number of probe spots that are in a row of the pattern formed by the probe spots.

In some embodiments, the probe spots may be preferred to be arranged in an N×N matrix or a hexagonal shape, to achieve a better fill factor for the round, optical aberration free zone of each probe spot. With that said, the rotation angle would remain $$\varphi = \tan^{-1}\frac{1}{N}.$$

Figure 10:
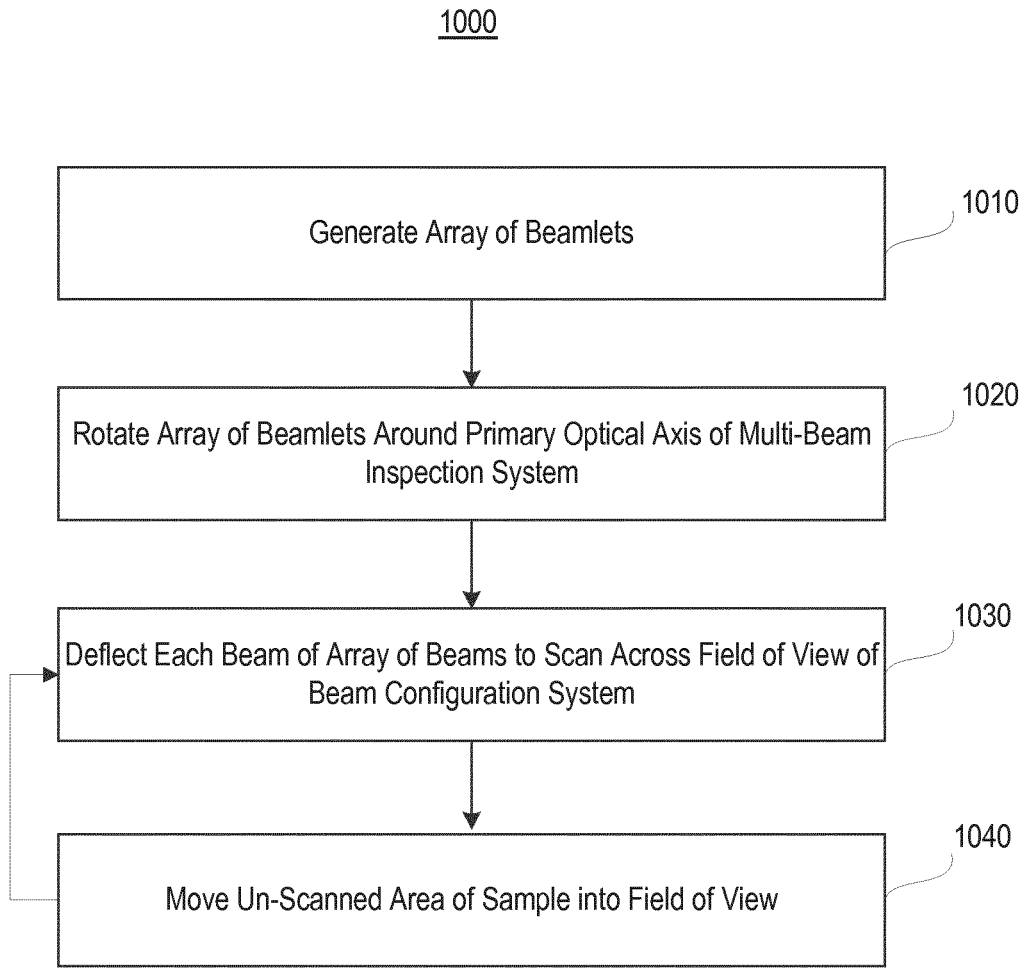
FIG. 10 is a flowchart of a multi-beam scanning method, consistent with embodiments of the present disclosure.

FIG. 10 is a flowchart of a multi-beam scanning method 1000, consistent with the embodiments illustrated in FIGS. 8A, 8B, and 9. For example, method 1000 may be used in e-beam tool 40 to improve the system throughput. Referring to FIG. 10, method 1000 includes the following steps.

In step 1010, an e-beam tool (e.g., e-beam tool 40 of FIGS. 1 and 2) generates an array of primary beamlets and projects them onto a surface of a sample (e.g., sample 208 of FIG. 2). The primary beamlets form an array of probe spots in a region to be inspected. The array of probe spots forms a predetermined pattern, such as an N×N matrix. In some embodiments, each column of the N×N matrix may be aligned with a moving direction of the sample.

In step 1020, the e-beam tool rotates the array of primary beamlets around a primary optical axis (e.g., primary optical axis 204 of FIG. 2) of the e-beam tool. The rotation may be performed in a way similar to that demonstrated in FIG. 9. The rotation is performed relative to the sample. In various embodiments, the e-beam tool may perform the rotation by controlling deflection scanning unit 232 to rotate the primary beamlets, rearranging the array of image-forming elements in e-beam tool 40, or rotating the sample. The rotation angle may be set equal to $$\tan^{-1}\frac{1}{N},$$

among others.

In step 1030, the e-beam tool deflects the array of primary beamlets to scan across a field of view of the tool. When the beam is rotated, the array of primary beamlets may be able to scan along non-overlapping and longer scan lines, as demonstrated in the right side of FIG. 8B and FIG. 11. The adjacent scan lines may be separated by a distance corresponding to a pixel size of the images generated by the e-beam tool.

In step 1040, after an area of the sample under the field of view is scanned, the e-beam tool moves an un-scanned area of the sample into the field of view. For example, as demonstrated in FIG. 3A, at the end of T3, probe spots 310A-310D may move to the next un-scanned area including sub-regions 301D, 302D, 303D, 304D, etc. As such, step 1030 may be repeated to continue scanning the un-scanned area.

In the disclosed embodiments, steps 1030 and 1040 may be repeated until the entire sample is inspected. Accordingly, the e-beam tool may be required to operate in a "step and scan" mode, in which the sample stage (e.g., motorized stage 209) stays at a position while the array of primary beamlets is deflected to scan an area in the field of view (step 1030), and moves (or "step") to a next position such that an un-scanned area "jumps" into the field of view of the e-beam tool (step 1030). For example, as described in connection with FIGS. 3A and 3B, at the end of time period T3, the movement of 10 W in −y direction may be achieved by moving the sample in the y direction. However, because in the "step and scan" mode the scanning repeatedly waits for the sample stage to step and settle, the "step and scan" mode is usually slower than a "continuous scan" mode, in which the sample stage continuously moves at a slow speed while the primary beamlets are deflected to scan the sample.

Figure 11:
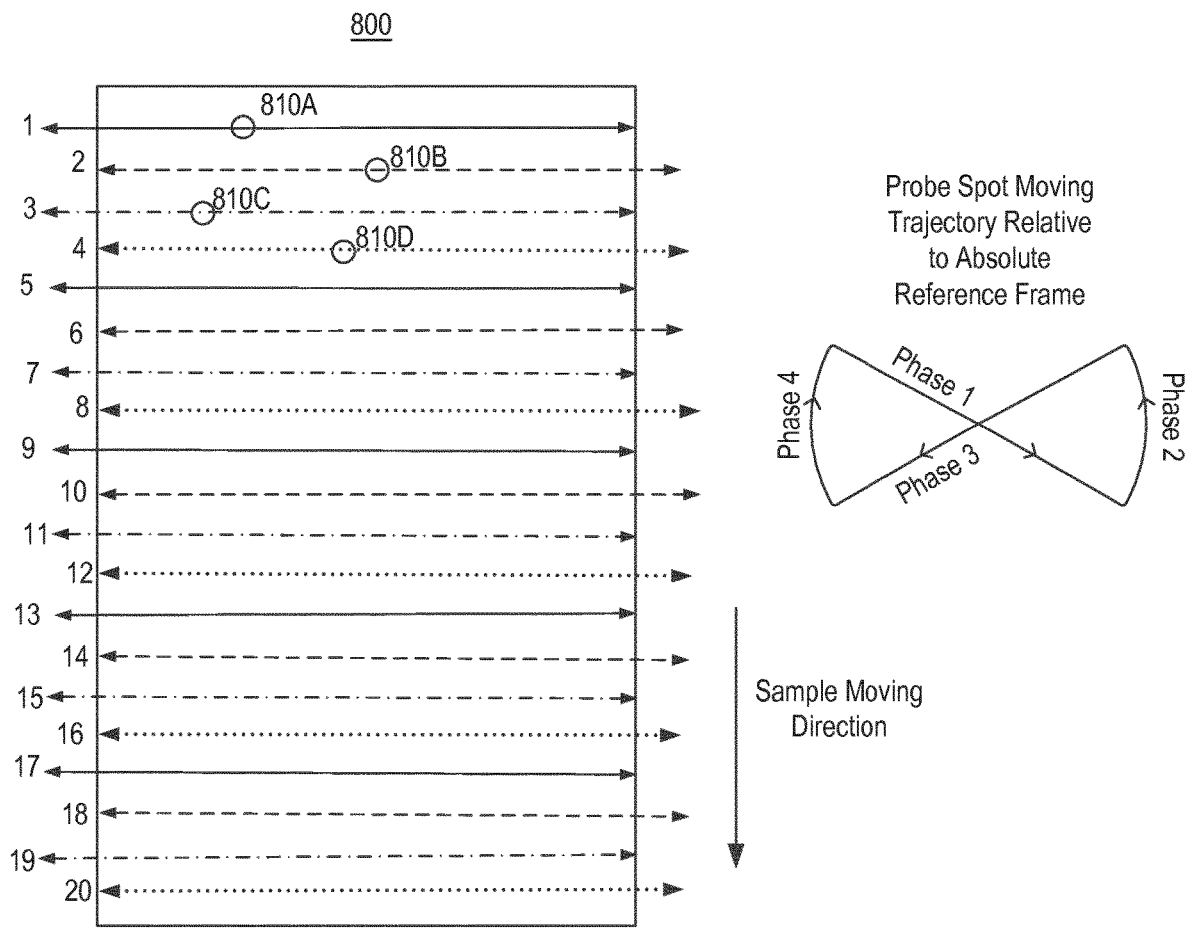
FIG. 11 is a schematic diagram illustrating a multi-beam interlaced scanning pattern, consistent with embodiments of the present disclosure.

To allow the above-described beam rotation method to be used with the faster "continuous scan" mode, the rotated primary beamlets may be configured to scan the sample using an interlaced scanning pattern, as described in FIG. 11, which illustrates an exemplary multi-beam interlaced scanning pattern, consistent with embodiments of the present disclosure. As shown in FIG. 11, after the probe spots 810A-810D in FIGS. 8A and 8B are rotated, the e-beam tool may control the primary beamlets such that: probe spot 810A moves along scan line 1, 5, 9, 13, 17, etc.; probe spot 810B moves along scan line 2, 6, 10, 14, 18, etc.; probe spot 810C moves along scan line 3, 7, 11, 15, 19, etc.; and probe spot 810D moves along scan line 4, 8, 12, 16, 20, etc. These scan lines are substantially parallel to each other. This way, probe spots 810A-810D may move among different scan lines while the sample stage moves continuously. By utilizing such a technique, a large "jump" of the sample stage may be avoided.

The right side of FIG. 11 shows an exemplary moving trajectory of a probe spot relative to the absolute reference frame. The trajectory may be divided into four phases. In phase 1, the probe spot follows the movement of the sample and scans along a first direction. In phase 2, the probe spot moves against the moving direction of the sample, so as to arrive at the starting point of a second scan line. In phase 3, the probe spot follows the movement of the sample and scans along a second direction. In phase 4, the probe spot moves against the moving direction of the sample, so as to arrive at the starting point of a third scan line. The four phases are repeated during the interlaced scanning.

Figure 12:
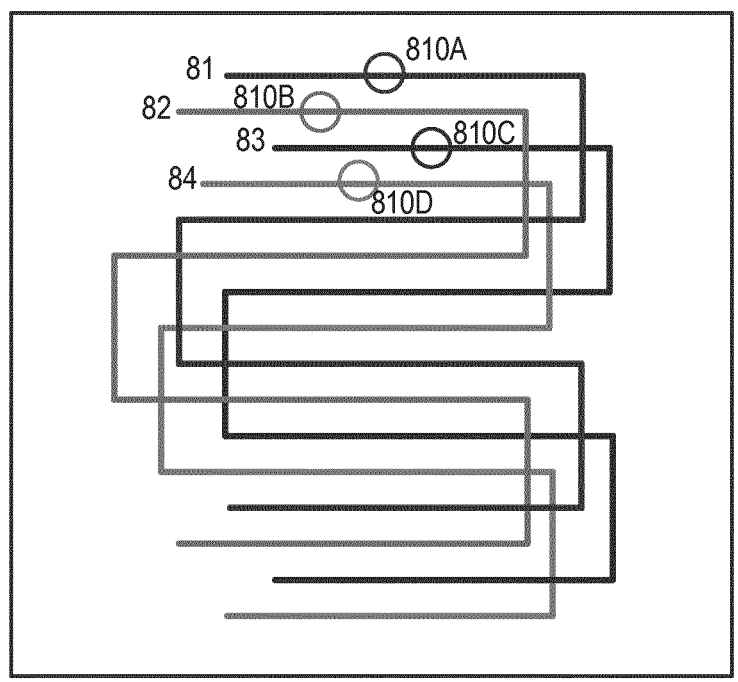
FIG. 12 is a schematic diagram illustrating moving trajectories of multiple probe spots relative to a sample during an interlaced scanning, consistent with embodiments of the present disclosure

FIG. 12 shows exemplary moving trajectories of probe spots 810A-810D relative to the sample during the interlaced scanning, consistent with the embodiment illustrated in FIG. 11. Referring to FIG. 12, moving trajectories 81, 82, 83, and 84 correspond to probe spots 810A-810D, respectively. Each of moving trajectories 81, 82, 83, and 84 has a continuous pattern, formed during the continuous movement of the sample.

Figure 13:
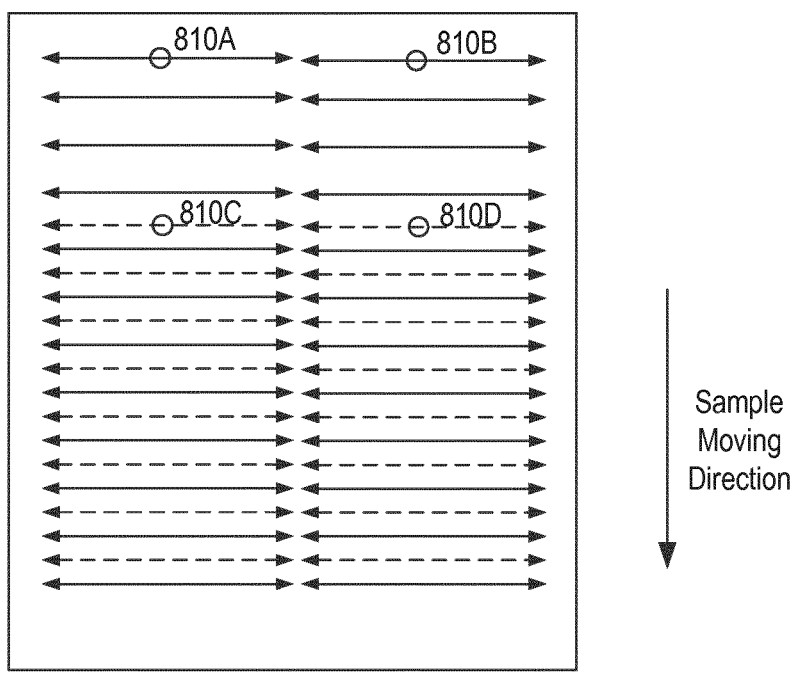
FIG. 13 is a schematic diagram illustrating a multi-beam interlaced scanning pattern, consistent with embodiments of the present disclosure.

Although in the above-described embodiments the interlaced scanning is used in conjunction with the beam rotation, it is contemplated that the interlaced scanning may also be applied to multi-beam scanning without beam rotation. FIG. 13 is a schematic diagram illustrating a multi-beam interlaced scanning pattern without beam rotation, consistent with embodiments of the present disclosure. Referring to FIG. 13, probe spots 810A-810D are arranged in a 2×2 matrix, with each column of the matrix being aligned with a moving direction of the sample. That is, the pattern of probe spots 810A-810D is not rotated with reference to the sample. As the sample moves continuously along a certain direction (e.g., downward direction as demonstrated in FIG. 13), any un-scanned area in region 800 first enters the fields of view of probe spots 810A and 810B, and then enters the fields of view of probe spots 810C and 810D. Each of probe spots 810A-810D can form scan lines on region 800. By properly controlling the beam distance, i.e., beam pitch, between probe spots 810A and 810C along the sample moving direction, the scan lines formed by probe spots 810A and 810C can have an interlaced pattern. Similarly, by properly controlling the beam distance, i.e., beam pitch, between probe spots 810B and 810D along the sample moving direction, the scan lines formed by probe spots 810B and 810D have an interlaced pattern. With the interfaced scanning, multi-beam scanning may be combined with the fast "continuous scan mode," with or without beam rotation. Thus, the system throughput is improved. Moreover, since beam rotation is not required, detector (e.g., electron detector 240 of FIG. 2) complexity coupled with the beam rotation may be avoided.

Figure 14:
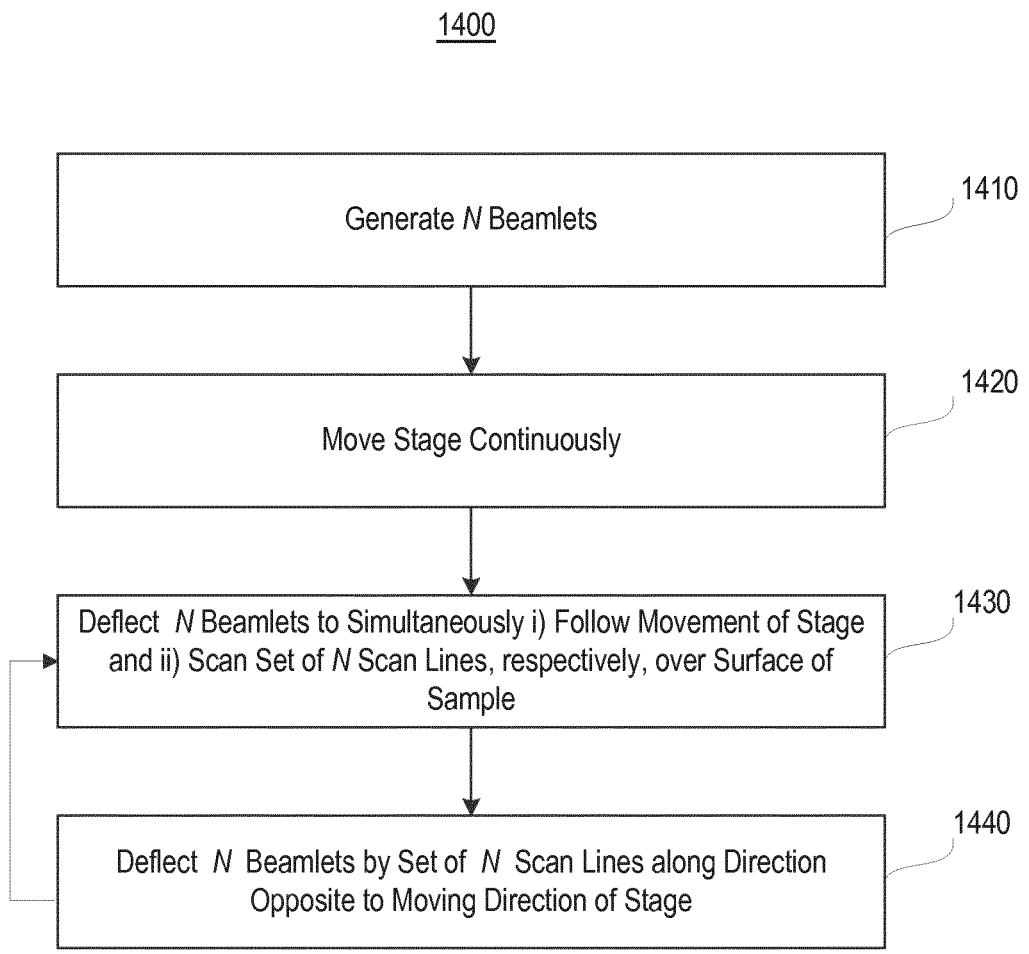
FIG. 14 is a flowchart of a multi-beam interlaced scanning method, consistent with embodiments of the present disclosure.

FIG. 14 is a flowchart of a multi-beam interlaced scanning method 1400, consistent with the embodiments illustrated in FIGS. 11-13. For example, method 1400 may be used in e-beam tool 40 to improve the system throughput. Referring to FIG. 14, method 1400 includes the following steps.

In step 1410, an e-beam tool (e.g., e-beam tool 40 of FIGS. 1 and 2) generates an array of N primary beamlets and projects them onto a surface of a sample (e.g., sample 208 of FIG. 2). N is an integer equal to or larger than 2. The primary beamlets form an array of N probe spots in a region to be inspected.

In step 1420, the e-beam tool controls the sample to move continuously. For example, the e-beam tool may control a stage (e.g., motorized stage 209 of FIG. 2) to move the sample continuously.

In step 1430, as demonstrated in FIGS. 11-13, the e-beam tool deflects the N primary beamlets to simultaneously i) follow the movement of the sample, and ii) scan N scan lines, respectively, over the sample surface.

In step 1440, after the N scan lines are scanned, the e-beam tool deflects, relative to the sample, the N primary beamlets by the N scan lines in a direction opposite to the sample moving direction, such the probe spots formed by the primary beamlets arrive at the starting points of a new group of scan lines. Consistent with the disclosed embodiments, steps 1430 and 1440 are performed repeatedly, so as to form an interlaced scanning pattern, e.g., the interlaced scanning pattern patterns illustrated in FIGS. 11-13.

As described above, to form the interlaced scanning pattern, the primary beamlets, or corresponding probe spots, may be required to be preciously spaced. For example, for a beam pitch of 10 μm, the beam alignment error may need to be limited within 1 nm to avoid unwanted gaps between adjacent probe spots that would leave part of the sample unscanned. To relax the requirement for beam alignment, a semi-interfaced scanning may be used in some embodiments.

Figure 15:
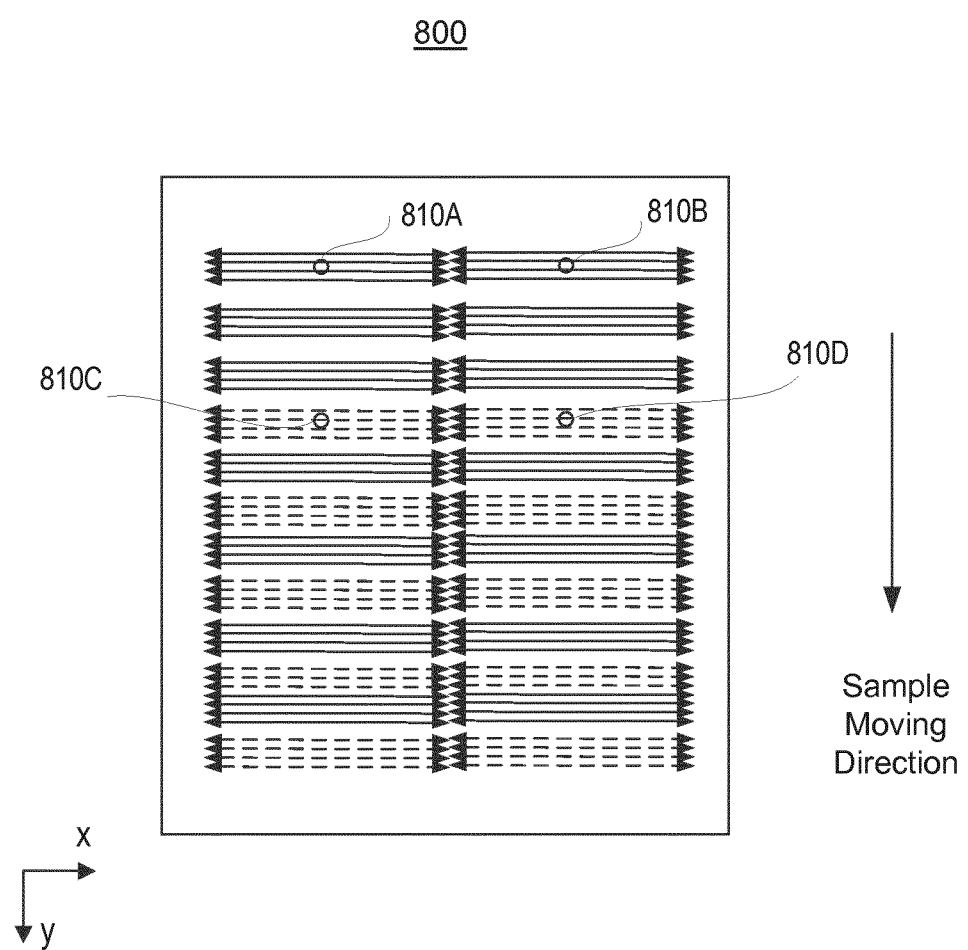
FIG. 15 is a schematic diagram illustrating a multi-beam semi-interlaced scanning pattern, consistent with embodiments of the present disclosure.

FIG. 15 is a schematic diagram illustrating a multi-beam semi-interlaced scanning pattern, consistent with embodiments of the present disclosure. As shown in FIG. 15, each of probe spots 810A-810D is allowed to first perform a continuous x-y scan (e.g., scan multiple scan lines) in a small area while the sample stage moves continuously. After the x-y scans are completed, the sample makes a small "jump" to move to a next un-scanned area in the fields of view of probe spots 810A-810D. As such, the areas scanned by probe spots 810A and 810C may form an interlaced pattern, and the areas scanned by probe spots 810B and 810D may form an interlaced pattern.

The semi-interfaced scanning uses proper spacing between probe spots 810A and 810C and between probe spots 810B and 810D. However, compared to interlaced scanning, the beam alignment is less critical in the semi-interfaced scanning because it allows the interlaced areas to have some overlap. Moreover, compared to the typical "step and scan" mode, the sample stage makes relatively small "jumps" in the semi-interfaced scanning and thus takes less time to jump and settle. Therefore, the semi-interfaced scanning may improve the system throughput.

Figure 16:
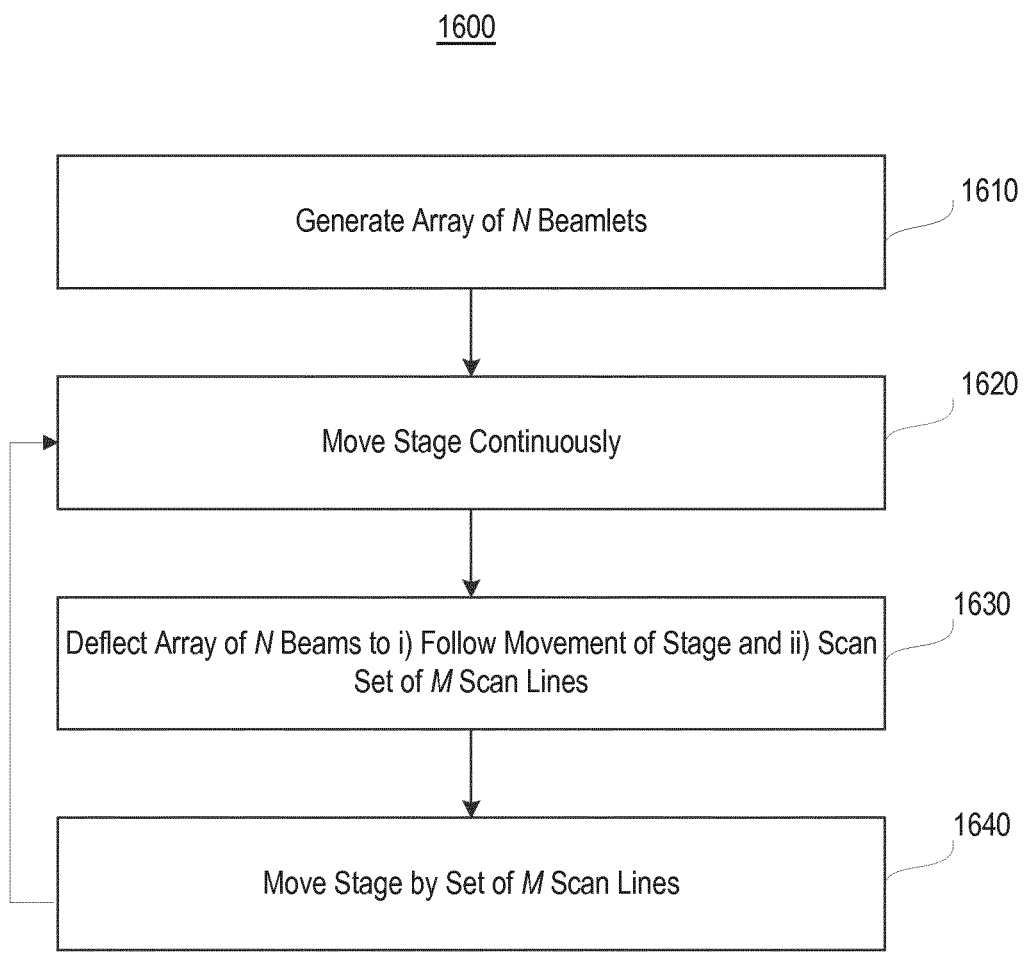
FIG. 16 is a flowchart of a multi-beam semi-interlaced scanning method, consistent with embodiments of the present disclosure.

FIG. 16 is a flowchart of a multi-beam semi-interlaced scanning method, consistent with embodiments of the present disclosure. For example, method 1600 may be used in an e-beam tool (e.g., e-beam tool 40 of FIGS. 1 and 2) to improve the system throughput. Referring to FIG. 16, method 1600 includes the following steps.

In step 1610, the e-beam tool generates an array of N primary beamlets and projects them onto a surface of a sample (e.g., sample 208 of FIG. 2). N is an integer equal to or larger than 2. The primary beamlets form an array of N probe spots in a region to be inspected.

In step 1620, the e-beam tool controls the sample to move continuously. For example, the e-beam tool may control a stage (e.g., motorized stage 209 of FIG. 2) to move the sample continuously.

In step 1630, as demonstrated in FIG. 15, the e-beam tool deflects the N primary beamlets to simultaneously i) follow the movement of the sample, and ii) scan a set of M scan lines within each beamlet's field of view, respectively, over the sample surface. M is an integer equal to or larger than 2.

In step 1640, as demonstrated in FIG. 15, after the N primary beamlets scan the set of M scan lines within their respective fields of view, the e-beam tool moves the sample to expose un-scanned areas to the fields of view of the N primary beamlets. In some embodiments, the e-beam tool may move the sample by M scan lines. This way, the areas scanned by the primary beamlets may form an interlaced pattern.

Consistent with the disclosed embodiments, steps 1630 and 1640 are performed repeatedly, such that an interlaced scanning pattern similar to that illustrated in FIG. 15 can be formed. Moreover, the semi-interfaced scanning process illustrated by FIGS. 15 and 16 can be used with or without beam rotation.

Figure 17:
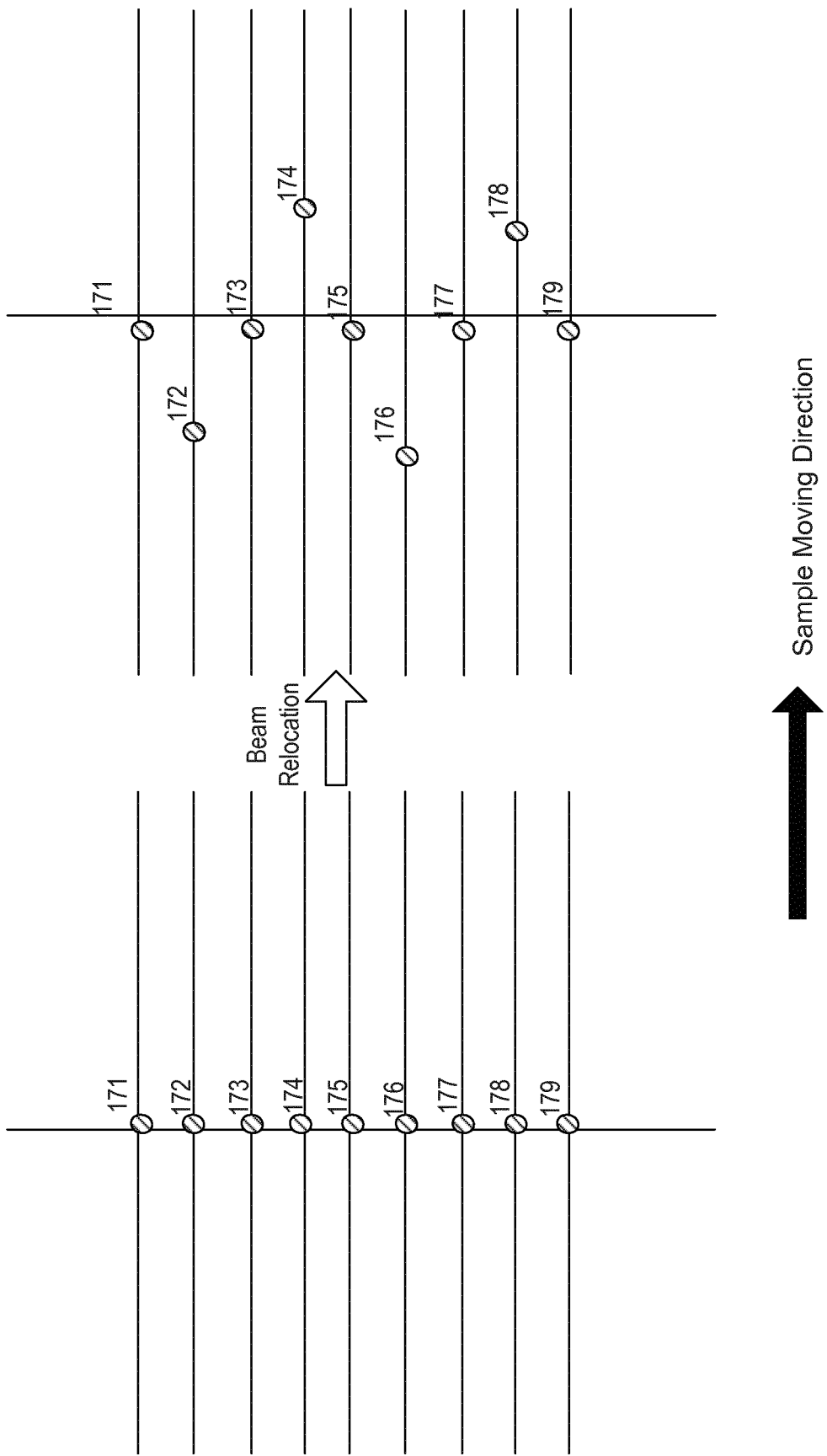
FIG. 17 is a schematic diagram illustrating a distribution of multiple primary beamlets on a surface of a sample before and after beam relocation, consistent with embodiments of the present disclosure.

As described above, the continuous-scan mode is usually faster and thus can achieve a higher throughput than the step-and-scan mode. FIG. 17 is a schematic diagram illustrating distributions of multiple primary beamlets in a continuous-scan mode, consistent with embodiments of the present disclosure. Referring to FIG. 17, an e-beam tool (e.g., e-beam tool 40 of FIGS. 1 and 2) may have nine primary beamlets 171, 172, 173, . . . , and 179. In some embodiments, to make the e-beam tool applicable with the continuous-scan mode, the nine primary beamlets may be lined up in a straight line perpendicular to the sample moving direction and separated by equal distance (see left side of FIG. 17). This way, each primary beamlet can continuously scan the sample without making any jumps. However, as described above in connection with FIGS. 8A and 8B, under this arrangement, the fields of view of the probe spots are overlapping, and therefore the system throughput is not maximized. To improve the system throughput, some or all of the primary beamlets may be relocated relative to other primary beamlets along the sample moving direction, so as to effectively increase beam distance along the direction perpendicular to the sample (see right side of FIG. 17). This way, similar to the beam rotation illustrated in FIGS. 8A and 8B, each primary beamlet can scan a longer scan line. Moreover, to keep the e-beam tool work in the continuous-scan mode, the e-beam tool may control the relocated primary beamlets to perform interlaced scanning, in a manner similar to that illustrated in FIGS. 7 and 8.

Figure 18:
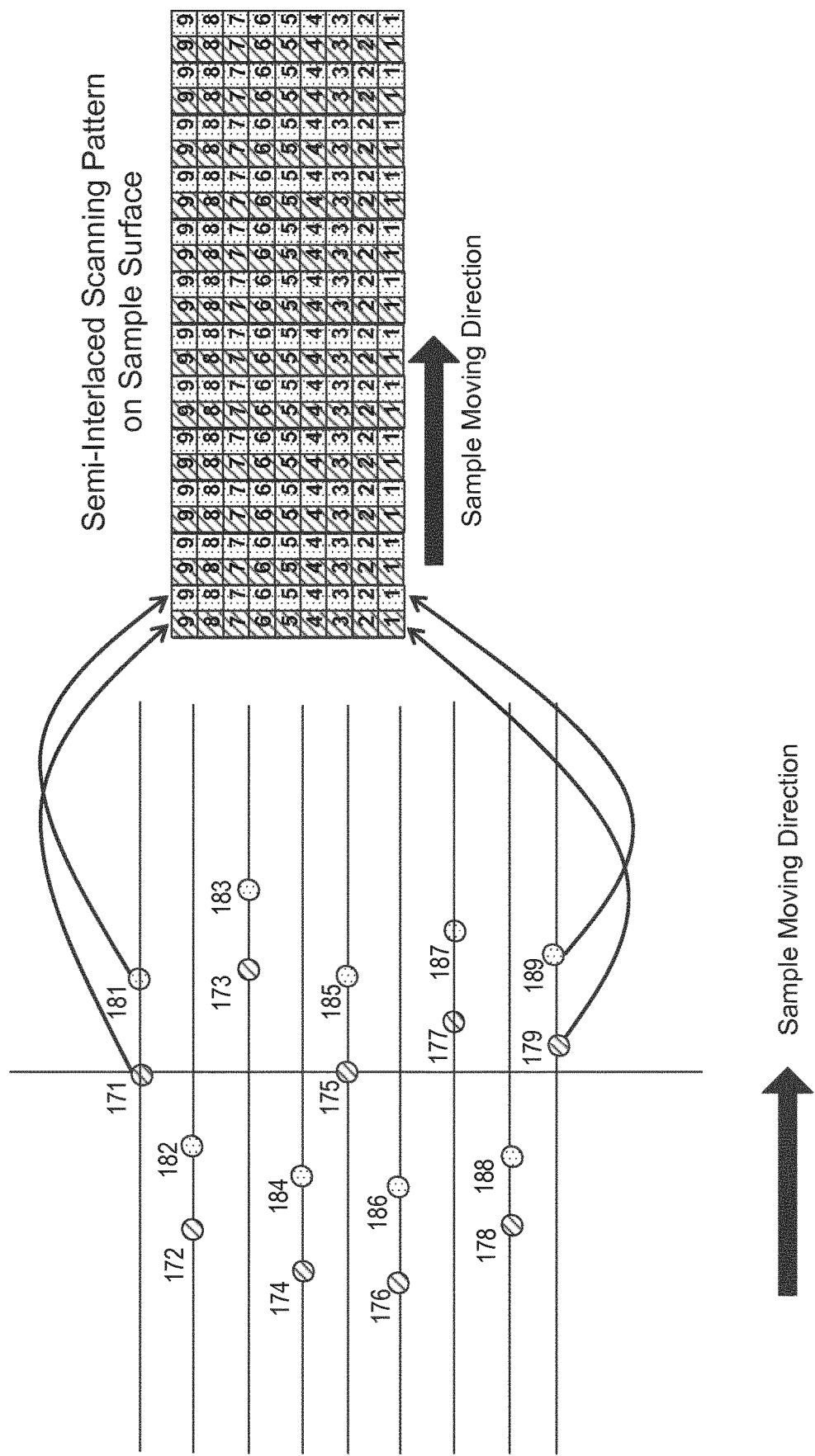
FIG. 18 is a schematic diagram illustrating a multi-beam scanning pattern in a "continuous scan" mode, consistent with embodiments of the present disclosure.

The embodiment in FIG. 17 may also be adapted to include multiple primary beamlets lined up along the sample moving direction. For example, referring to FIG. 18, the e-beam tool may further include primary beamlets 181-189, which are aligned with primary beamlets 171-179, respectively, along the sample moving direction, and are separated from primary beamlets 171-179, respectively, by an equal distance along the sample moving direction. Each pair of primary beamlets lined up along the sample moving direction may be controlled to perform semi-interlaced scanning, in a manner similar to that illustrated in FIG. 15, to reduce or avoid making big jumps. Alternatively, the group of primary beamlets 171-179 and the group of primary beamlets 181-189 may perform interlaced scanning separately (not shown in FIG. 18), in which case each pair of primary beamlets lined up along the sample moving direction successively scans the same area and thus frame average can be performed.

Figure 19:
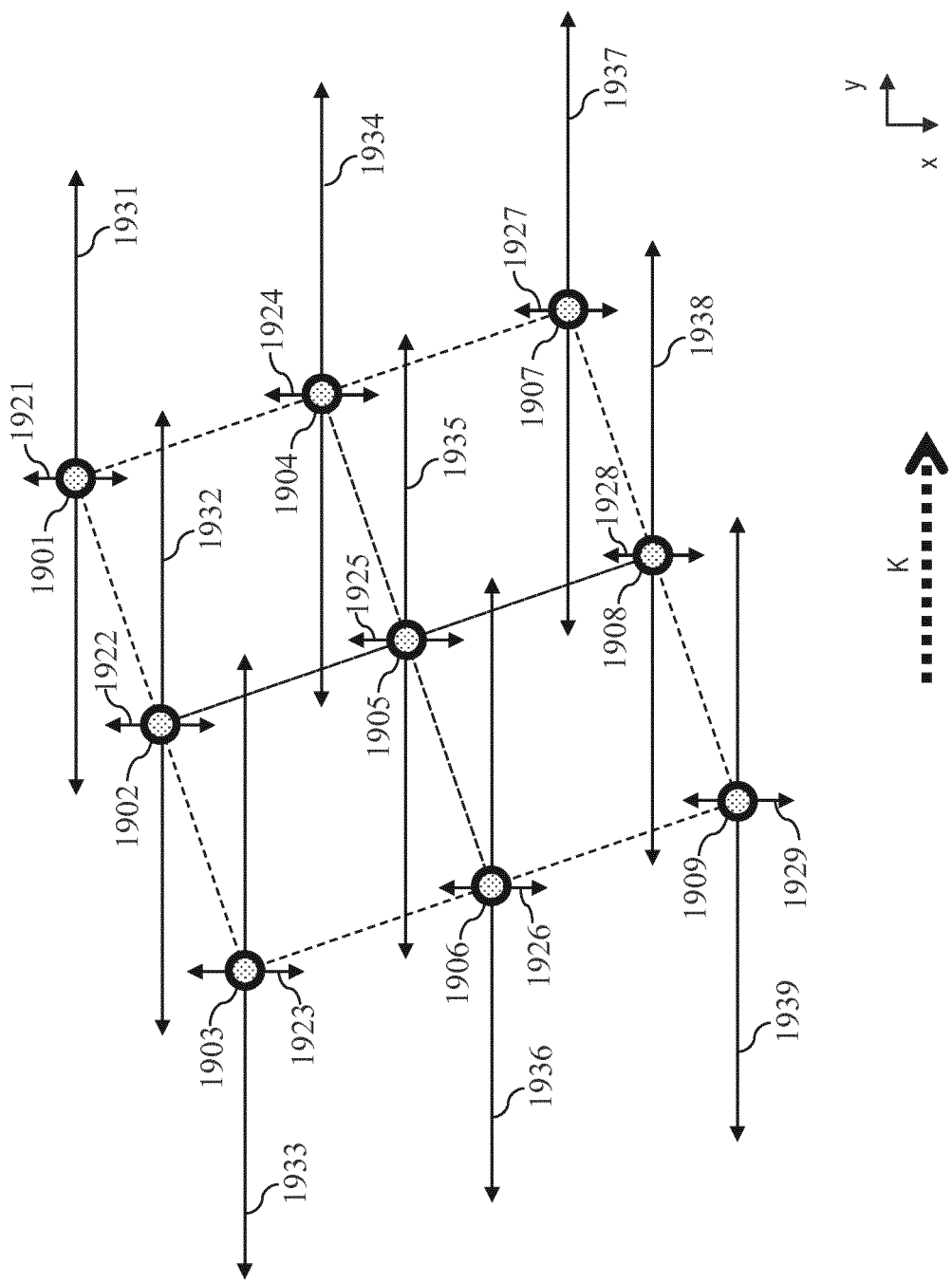
FIG. 19 is a schematic diagram illustrating an exemplary scanning pattern using a set of the rotated primary beamlets, consistent with embodiments of the present disclosure.

Reference is now made to FIG. 19 which is a schematic diagram illustrating an exemplary scanning pattern using a set of the rotated primary beamlets, consistent with embodiments of the present disclosure. As described earlier, to achieve higher system throughput, it is desirable that each primary beamlet scans a longer scan line. Maintaining a continuous and constant movement of a sample during inspection may also increase the throughput of the inspection system (e.g., continuous-scan mode described in the earlier sections).

FIG. 19 shows a multi-beam inspection system with a 3-by-3 array of primary beamlets creating nine probe spots 1901, 1902, . . . , 1909 arranged in a 3×3 matrix configuration. Similar to the earlier embodiments, a sample (e.g., sample 208 of FIG. 2) may move in y direction at a constant speed K while the sample is scanned by the 3-by-3 array of probe spots 1901-1909. In some embodiments, the 3-by-3 array of primary beamlets may be rotated by an angle relative to the sample moving direction. The rotation angle may be determined by the number of primary beamlets in a row (e.g., three in the 3-by-3 array configuration), as described in the Equation (12) with respect to FIG. 9. In some embodiments, the sample may be rotated by the rotation angle so that the probe spots are effectively rotated relative to the sample moving direction. In some embodiments, the beamlets and the sample may be rotated at the same time, thereby causing that the beamlets are rotated by the rotation angle relative to the sample moving direction.

In some embodiments, probe spots 1901-1909 may scan the sample in a direction perpendicular to the sample moving direction. For example, probe spots 1901-1909 may scan in the x direction as illustrated by arrows 1921-1929, while the sample moves in y direction. In such embodiments, the scan-width of a primary beamlet may be determined by how wide each primary beamlet can scan the sample without resulting in too much overlap between regions scanned by the adjacent primary beamlets (e.g., the span of movement of probe spot 1901 as illustrated by the length of arrow 1921). Even though the rotated beamlet configuration can support the continuous-scan mode, this relatively shorter scan-width on the x direction may limit the improvement of system throughput, because the overhead of scan pattern (e.g., the relative percentage of non-scanning beam movement with respect to scanning beam movement) could be materially high.

In some embodiments, probe spots 1901-1909 may scan the sample in a direction parallel to the sample moving direction. For example, probe spots 1901-1909 may move in the y direction as illustrated by arrows 1931-1939, while the sample also moves in the y direction. In such embodiments, the scan-width of a primary beamlet is not limited by the configuration of the primary beamlets (e.g., pitches or rotation angles), because increasing scan-width would not create any overlap between the regions scanned by the adjacent beamlets. And, the increased scan-width may improve system throughput because the overhead of scan pattern can be reduced significantly.

Although FIG. 19 illustrates a configuration of the primary beamlets with nine probe spots 1901-1909 arranged in a 3×3 matrix, it is appreciated that the principle disclosed herein may be applied to any number and configuration of primary beamlets, such as primary beamlets arranged in a 3×2, 4×4, 5×5, 3×5, 8×5, 20×20, or any size of matrix configuration.

Figure 20A:
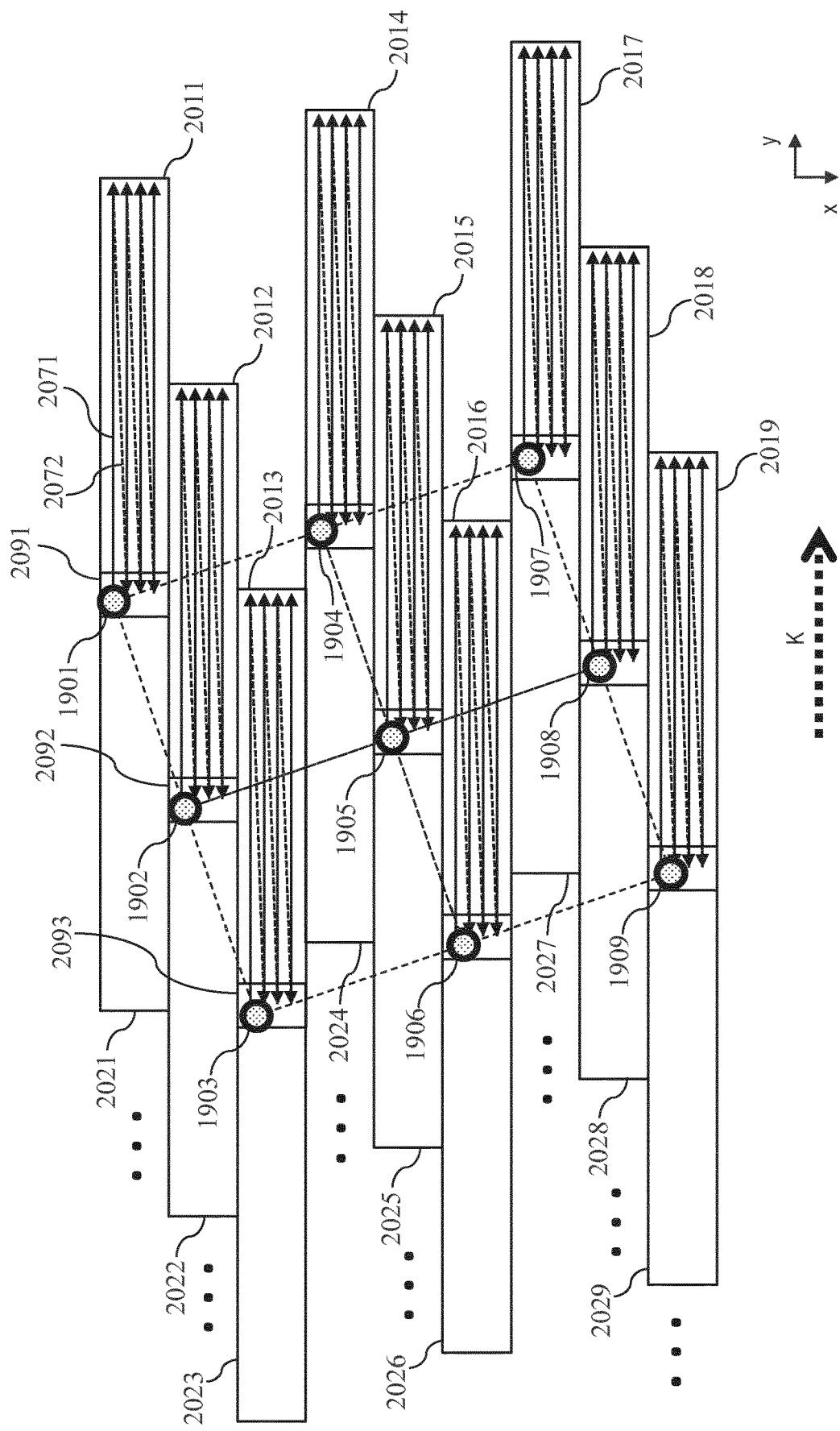
FIGS. 20A, 20B, 20C, and 20D are schematic diagrams illustrating exemplary multi-beam scanning patterns using the rotated primary beamlets shown in FIG. 19, consistent with embodiments of the present disclosure.

Reference is now made to FIGS. 20A, 20B, 20C, and 20D, which are schematic diagrams illustrating exemplary multi-beam scanning patterns using the rotated primary beamlets shown in FIG. 19, consistent with embodiments of the present disclosure. In some embodiments, the scanning direction of probe spots 1901-1909 is parallel to the sample moving direction. In such embodiments, each probe spot scans a plurality of scan sections positioned along the sample moving direction. For example, as shown in FIG. 20A, the first row of scan sections (e.g., scan section 2011, 2021, and so on) may be scanned by the primary beamlet corresponding to probe spot 1901. Similarly, the second row of scan sections (e.g., scan section 2012, 2022, and so on) may be scanned by the primary beamlet corresponding to probe spot 1902. Similarly, the third, fourth, fifth, sixth, seventh, eighth, and ninth row of scan sections may be scanned by probe spots 1903, 1904, 1905, 1906, 1907, 1908, and 1909, respectively.

In some embodiments, each scan section is scanned with a raster scan pattern. For example, within section 2011, probe spot 1901 may scan a scan line through a scanning route 2071 followed by a retrace route 2072 back to the other side to start scanning a next scan line. These steps may be performed repeatedly until all scan lines of the scan section are scanned. Although FIG. 20A illustrates a raster scan pattern within each scan section, it is appreciated that any other scanning method may be used to scan each scan section. For example, in some embodiments, probe spot 1901 may scan and retrace in opposite directions, e.g., scan from the right to the left and retrace from the left to the right.

Figure 20B:
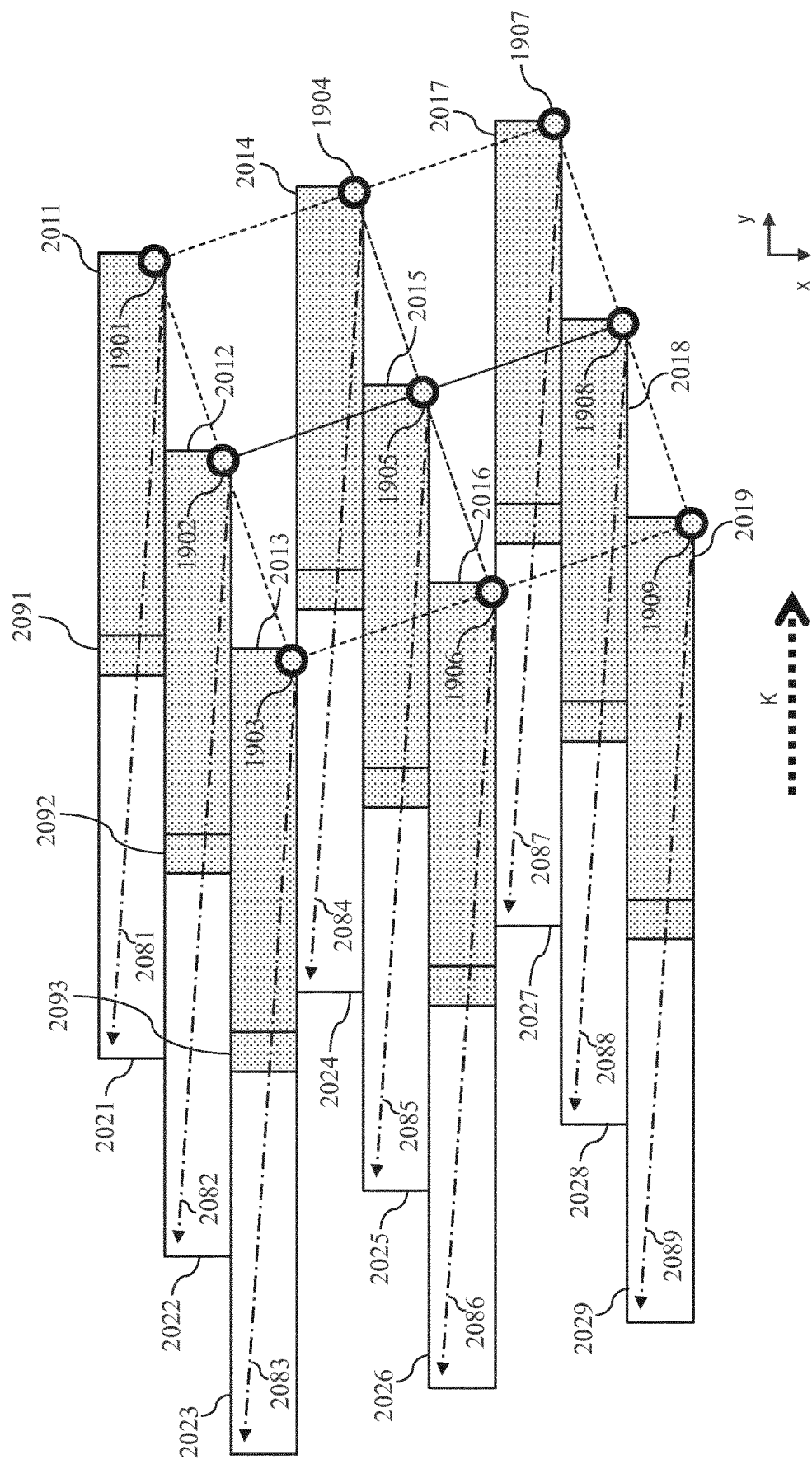

In some embodiments, probe spots 1901-1909 may scan a first set of scan sections first (e.g., scan sections 2011, 2012, 2013, . . . , 2019). After completion of scanning the first set of scan sections, probe spots 1901-1909 may be repositioned to prepare to scan a second set of scan sections (e.g., scan sections 2021, 2022, 2023, . . . , 2029). As shown in FIG. 20B, the repositioning of the primary beamlets may involve moving each probe spot from the point where the scanning of the first set is ended to the point where the scanning of the second set will begin, as illustrated with arrows 2081, 2082, 2083, . . . , 2089. After repositioning, probe spots 1901-1909 may start scanning the second set of scan sections. In some embodiments, the scanning and repositioning steps may repeat until the whole sample area-in-interest is scanned and inspected. Although, FIG. 20B illustrates that scanning of the first set ends at the far-right corner, it is appreciated that the end point of the scan may be different depending on various scan patterns used. For example, as described in the previous section, if opposite directions are used for scanning and retracing (e.g., scanning from the right to the left and retracing from the left to the right), scanning of the first set may end at the far-left corner. In such case, the repositioning distance may be shorter.

Figure 20C:
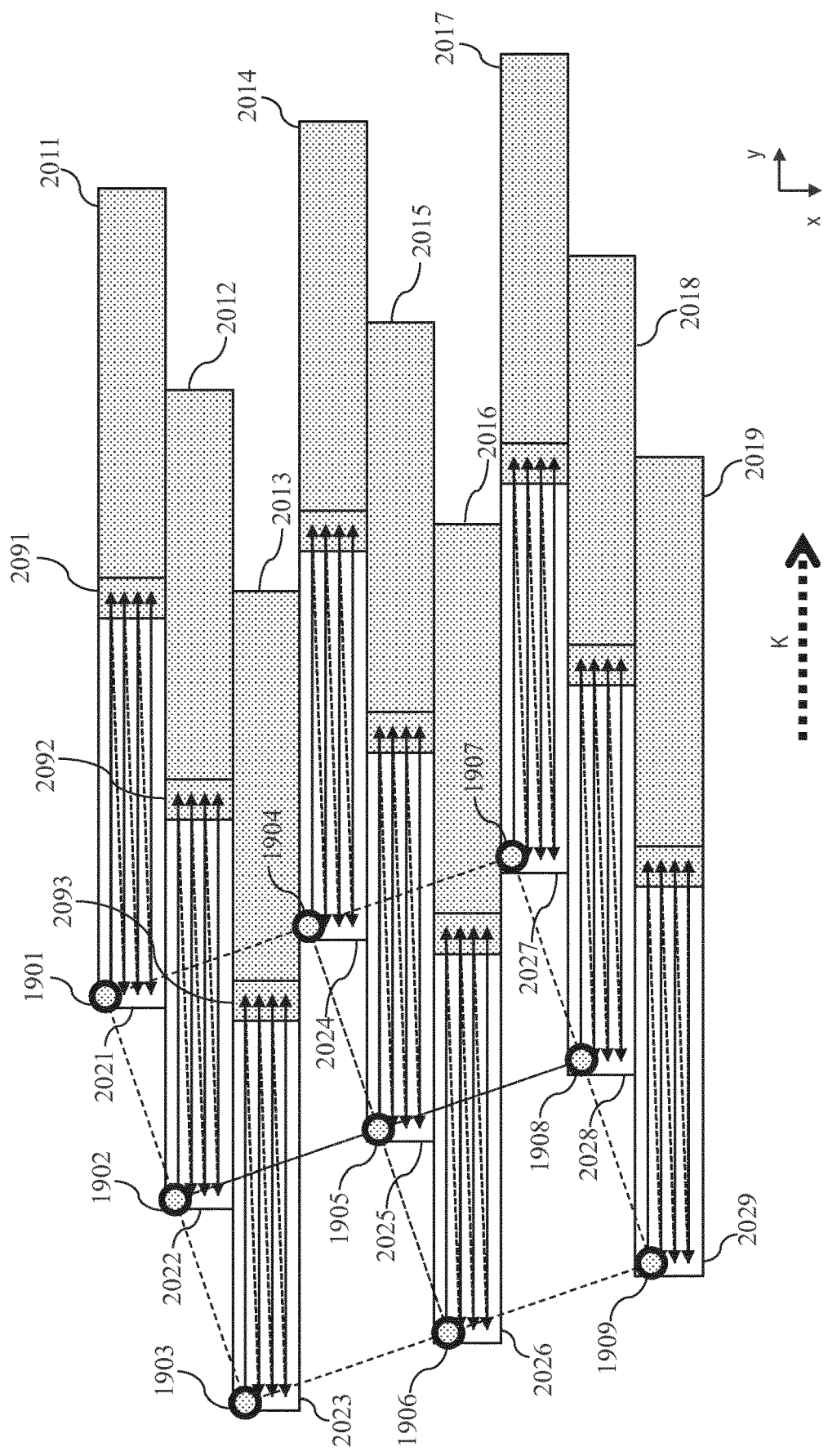

In order to avoid any gap in scanned data between adjacent scan sections (e.g., between scan section 2011 and 2021) that may be introduced during repositioning of the primary beamlets, the adjacent scan sections may partially overlap. For example, as shown in FIG. 20C, scan section 2011 and 2021 may partially overlap, thereby creating an overlap region 2091. Similarly, scan section 2012 and 2022 may create an overlap region 2092. These overlap regions may be scanned two or more times. For example, overlap region 2091 may be scanned first during the scanning of scan section 2011, and then scanned second time during the scanning of scan section 2021. A controller (e.g., controller 50 of FIG. 2) may collect scan data, including multiple scan data from each overlap region, and process the scan data to produce a continuous image of the sample for inspection.

Figure 20D:
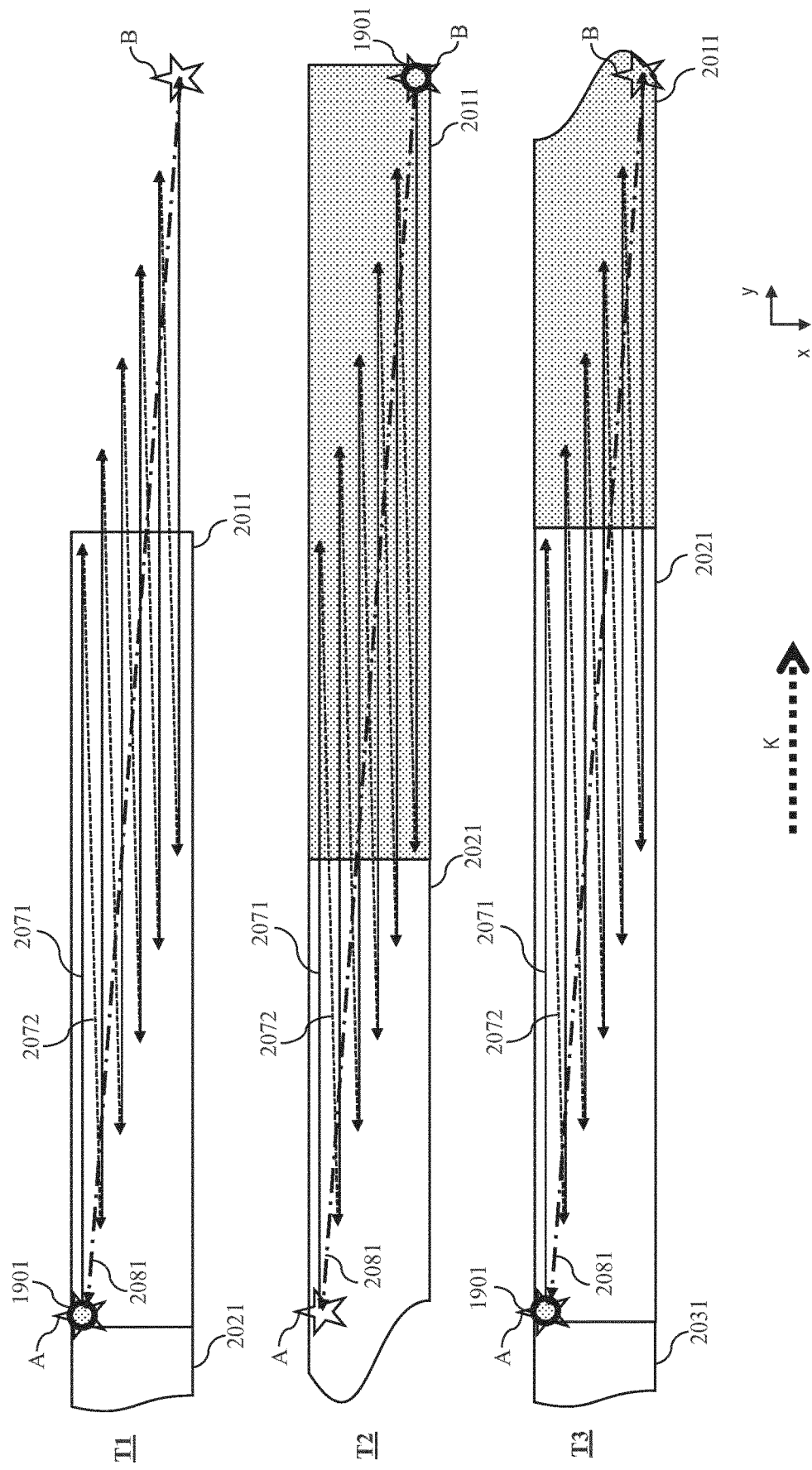

In some embodiments, the scanning and repositioning steps may occur while the stage holding the sample is continuously moving at a constant speed. In such embodiments, the movement of probe spots may be adjusted to accommodate the continuous movement of the stage. For example, FIG. 20D illustrates the movement of probe spot 1901 over time, relative to a fixed position of the multi-beam inspection tool, when scanning occurs while the sample is continuously moving in the y direction. In such situations, the routes of the beamlets for scanning (e.g., scanning route 2071) and retracing (e.g., retracing route 2072) steps may be adjusted to accommodate the movement of the stage. For example, scanning route 2071 may be extended because the sample is also moving in the same direction. Retracing route 2072 may be shortened because the sample is moving in the opposite direction relative to the retracing direction, e.g., by the time probe spot 1901 is retraced back to the left side, the sample may have been moved further right.

As described with respect to the earlier embodiments, in some embodiments, the controller may control the movement of primary beamlets and the stage so that the primary beamlets may just repeat a pattern of movement. With the controller controlling the speeds of scanning, retracing, repositioning, and stage movement, probe spot 1901 may continuously repeat the movement pattern as shown in FIG. 20B.

For example, with respect to FIG. 20D, at T1, probe spot 1901 is positioned at a position A to start scanning scan section 2011. During the time period from T1 to T2, probe spot 1901 performs scanning and retracing back and forth, while the sample is moving continuously in the y direction, until probe spot 1901 completes scanning the last scan line of the section. At T2, probe spot 1901 reaches to a position B at the completion of scanning scan section 2011. During the time period from T2 to T3, probe spot 1901 is being repositioned back to position A, while the sample is moving continuously in the y direction. At T3, probe spot 1901 is repositioned back to position A.

Simultaneously, at T3, the next scan section (e.g., scan section 2021) moves in and the upper-left corner (where scanning within the section begins) of scan section 2021 may align with position A. Accordingly, in such scenarios, probe spot 1901 may just continuously repeat the movement pattern between position A and position B as shown in FIG. 20D. With this repeated movement of probe spot 1901, the corresponding row of scan sections (e.g., scan section 2011, 2021, 2031, so on) may be continuously scanned by probe spot 1901.

Although FIGS. 20A, 20B, and 20C illustrate a configuration of the primary beamlets with nine probe spots 1901-1909 arranged in a 3×3 matrix, it is appreciated that the principle disclosed herein may be applied to any number and configuration of primary beamlets, such as primary beamlets arranged in a 3×2, 4×4, 5×5, 3×5, 8×5, 20×20, or any size of matrix configuration.

The embodiments may further be described using the following clauses:

1. A multi-beam tool comprising:
    a beam configuration system including a charged-particle source for generating a primary beam of charged particles, a stage holding a sample, and a deflector system between the charged-particle source and the stage configured to split the primary beam into an array of beams,
    wherein the beam configuration system is configured to provide a rotated beam configuration with a rotation angle determined based on a number of beams in a row of the array of beams.
2. The multi-beam tool of clause 1, wherein:
    the array of beams is disposed around an optical axis of the multi-beam tool; and
    the rotated beam configuration includes the stage being configured to be rotated around the optical axis.
3. The multi-beam tool of clause 1, wherein:
    the array of beams is disposed around an optical axis of the multi-beam tool; and
    the rotated beam configuration includes the deflector system being configured to rotate the array of beams around the optical axis.
4. The multi-beam tool of any one of clauses 1 to 3, wherein:
    the multi-beam tool is configured to generate an image of a surface area of the sample; and
    the rotated beam configuration enables the array of beams to scan an area larger than the imaged surface area.
5. The multi-beam tool of any of clauses 1 to 4, wherein:
    the stage is configured to move along a first direction; and
    the array of beams scan across the field of view includes the array of beams scan a set of scan lines that cover the field view along a second direction.
6. The multi-beam tool of clause 5, wherein the second direction is, relative to the sample, substantially perpendicular to the first direction.
7. The multi-beam tool of clause 5, wherein the second direction is, relative to the sample, substantially parallel to the first direction.
8. The multi-beam tool of any one of clauses 5 to 7, wherein the set of scan lines is spaced apart by a distance corresponding to a pixel size of an image generated by the multi-beam tool.
9. The multi-beam tool of any one of clauses 1 to 8, wherein the beam configuration system further includes a controller coupled with the stage, the controller being configured to control movement of the stage.
10. The multi-beam tool of any one of clauses 1 to 9, wherein the beam configuration system further includes a controller coupled with the deflector system, the controller being configured to control the deflector system to deflect the array of beams.
11. A multi-beam tool comprising:
    a beam configuration system including a charged-particle source for generating a primary beam of charged particles, a stage configured to hold a sample and configured to move in a first direction, and a deflector system between the charged-particle source and the stage, the beam configuration system being configured to:
    split the primary beam into n beams, wherein n is an integer and n≥2;
    rotate the n beams with reference to the first direction, such that the n beams are spaced apart along the first direction;
    deflect the n beams to simultaneously i) follow movement of the stage and ii) scan one or more sets of n scan lines over a surface of the sample.
12. The multi-beam tool of clause 11, wherein
    the one or more sets of n scan lines include a first set of n scan lines spread over a first distance along the first direction; and
    the beam configuration system is further configured to:
    after the first set of n scan lines is scanned, offset the n beams by the first distance along a direction opposite to the first direction; and
    deflect the n beams to simultaneously i) follow the movement of the stage and ii) scan a second set of n scan lines over the surface of the sample.
13. The multi-beam tool of clause 12, wherein the first and second sets of n scan lines are substantially parallel lines.
14. The multi-beam tool of any one of clauses 12 and 13, wherein the each of the first and second sets of n scan lines is spaced apart by a distance corresponding to a pixel size of an image generated by the multi-beam tool.
15. The multi-beam tool of any one of clauses 11 to 14, wherein the one or more sets of n scan lines are, relative to the sample, along a second direction substantially perpendicular to the first direction.
16. The multi-beam tool of any one of clauses 11 to 14, wherein the one or more sets of n scan lines are, relative to the sample, along a second direction substantially parallel to the first direction.

17. The multi-beam tool of any one of clauses 11 to 16, wherein:
   the n beams are projected to the surface of the sample and form n probe spots on the surface; and
   the n beams follow the movement of the stage includes the n probe spots move in the first direction at a same speed as the stage.
18. The multi-beam tool of any one of clauses 11 to 17, wherein the stage moves at a constant speed.
19. The multi-beam tool of any one of clauses 11 to 18, wherein the beam configuration system is configured to:
   rotate the n beams with a rotation angle determined based on a number of beams in a row of the n beams.
20. The multi-beam tool of clause 19, wherein:
   the n beams are disposed around an optical axis of the multi-beam tool; and
   the beam configuration system being configured to rotate the n beams includes the beam configuration system being configured to rotate the stage around the optical axis.
21. The multi-beam tool of clause 19, wherein:
   the n beams are disposed around an optical axis of the multi-beam tool; and
   the beam configuration system being configured to rotate the n beams includes the deflector system being configured to rotate the n beams around the optical axis.
22. The multi-beam tool of any one of clauses 11 to 21, wherein the beam configuration system further includes a controller coupled with the stage, the controller being configured to control the movement of the stage.
23. The multi-beam tool of any one of clauses 11 to 22, wherein the beam configuration system further includes a controller coupled with the deflector system, the controller being configured to control the deflection of the n beams.
24. A multi-beam tool comprising:
   a beam configuration system including a charged-particle source configured to generate a primary beam of charged particles, a stage configured to hold a sample and configured to move in a first direction, and a deflector system between the charged-particle source and the stage configured to split the primary beam into an array of beams,
   wherein the beam configuration system is configured to:
   deflect, via the deflector system, the array of beams to i) scan a first set of scan lines in a field of view of the beam configuration system and ii) follow movement of the stage during the scanning of the first set of scan lines, wherein the first set of scan lines are spread over a first distance along the first direction;
   after the first set of scan lines is scanned, move the stage in the first direction by the first distance;
   deflect, via the deflector system, the array of beams to i) scan a second set of scan lines in the field of view of the beam configuration system and ii) follow movement of the stage during the scanning of the second set of scan lines, and
   move the stage in the first direction, when the first and second sets of scan lines are scanned.
25. The multi-beam tool of clause 24, wherein:
   the array of beams includes a first beam; and
   wherein the beam configuration system being configured to deflect, via the deflector system, the array of beams to i) scan a first set of scan lines in a field of view of the beam configuration system and ii) follow movement of the stage during the scanning of the first set of scan lines includes the beam configuration system being configured to:
   deflect the first beam to simultaneously i) follow movement of the stage and ii) scan a first scan line;
   after the first scan line is scanned, deflect the first beam by a predetermined distance along a direction opposite to the first direction; and
   deflect the first beam to simultaneously i) follow the movement of the stage and ii) scan a second scan line.
26. The multi-beam tool of any one of clauses 24 and 25, wherein the beam configuration system is further configured to:
   project the array of beams to a surface of the sample to form an array of probe spots on the surface,
   wherein the array of beams follows the movement of the stage includes the array of probe spots moves in the first direction at a same speed as the stage.
27. The multi-beam tool of any one of clauses 24 to 26, wherein during the scanning of the first and second sets of scan lines, the beam configuration system is further configured to move the stage in the first direction at a constant speed.
28. The multi-beam tool of any one of clauses 24 to 27, wherein each of the first and second sets of scan lines is spaced apart by a distance corresponding to a pixel size of an image generated by the multi-beam tool.
29. The multi-beam tool of any one of clauses 24 to 28, wherein the first and second sets of scan lines are, relative to the sample, substantially perpendicular to the first direction.
30. The multi-beam tool of any one of clauses 24 to 29, wherein the first and second sets of scan lines are substantially parallel lines.
31. The multi-beam tool of any one of clauses 24 to 30, wherein the beam configuration system further includes a controller coupled with the stage, the controller being configured to control the movement of the stage.
32. The multi-beam tool of any one of clauses 24 to 31, wherein the beam configuration system further includes a controller coupled with the deflector system, the controller being configured to control the deflecting of the array of beams.
33. A method comprising:
   generating, by a multi-beam tool, a primary beam of charged particles;
   splitting, by the multi-beam tool, the primary beam into an array of beams; and
   rotating the array of beams, by the multi-beam tool and relative to the sample to be scanned, by a rotation angle determined based on a number of beams in a row of the array of beams.
34. The method of clause 33, wherein rotating the array of beams relative to the sample comprises rotating the sample around an optical axis of the multi-beam tool.
35. The method of clause 33, wherein rotating the array of beams relative to the sample comprises rotating the array of beams around an optical axis of the multi-beam tool.
36. The method of any one of clauses 33 to 35, wherein rotating the array of beams relative to the sample enables the array of beams to scan an area larger than a sample surface area imaged by the multi-beam tool.
37. The method of any one of clauses 33 to 36, further comprising:
   moving, by the multi-beam tool, the sample along a first direction,
   wherein the array of beams scan a set of scan lines that cover the imaged surface area along a second direction.
38. The method of clause 37, wherein the second direction is, relative to the sample, substantially perpendicular to the first direction.

39. The method of clause 37, wherein the second direction is, relative to the sample, substantially parallel to the first direction.
40. The method of any one of clauses 37 to 39, wherein the set of scan lines is spaced apart by a distance corresponding to a pixel size of an image generated by the multi-beam tool.
41. A method comprising:
   moving, by a multi-beam tool, a sample in a first direction;
   generating, by the multi-beam tool, a primary beam of charged particles;
   splitting, by the multi-beam tool, the primary beam into n beams, wherein n is an integer and n≥2;
   rotating, by the multi-beam tool, the n beams with reference to the first direction, such that the n beams are spaced apart along the first direction; deflecting, by the multi-beam tool, the n beams to simultaneously i) follow movement of the sample and ii) scan one or more sets of n scan lines over a surface of the sample.
42. The method of clause 41, wherein the one or more sets of n scan lines include a first set of n scan lines spread over a first distance along the first direction, the method further comprising: after the first set of n scan lines is scanned, offsetting, by the multi-beam tool, the n beams by the distance along a direction opposite to the first direction; and deflecting, by the multi-beam tool, the n beams to simultaneously i) follow the movement of the sample and ii) scan a second set of n scan lines over the surface of the sample.
43. The method of clause 42, wherein the first and second sets of n scan lines are substantially parallel lines.
44. The method of any one of clauses 42 and 43, wherein each of the first and second sets of n scan lines is spaced apart by a distance corresponding to a pixel size of an image generated by the multi-beam tool.
45. The method of any one of clauses 42 to 44, wherein the one or more sets of n scan lines are, relative to the sample, along a second direction substantially perpendicular to the first direction.
46. The method of any one of clauses 42 to 44, wherein the one or more sets of n scan lines are, relative to the sample, along a second direction substantially parallel to the first direction.
47. The method of any one of clauses 45 to 46, wherein the first set of n scan lines covers a field of view of the multi-beam tool along the second direction.
48. The method of any one of clauses 42 to 47, wherein the n beams are projected to the surface of the sample and form n probe spots on the surface, the method further comprising:
   deflecting the n beams to allow the n probe spots to move in the first direction at a same speed as the sample.
49. The method of any one of clauses 42 to 48, wherein moving the sample in the first direction comprises moving the sample in the first direction at a constant speed.
50. A method comprising:
   moving a sample in a first direction;
   generating, by a multi-beam tool, a primary beam of charged particles;
   splitting, by the multi-beam tool, the primary beam into an array of beams;
   deflecting, by the multi-beam tool, the array of beams to i) scan a first set of scan lines in a field of view of the multi-beam tool and ii) follow movement of the sample during the scanning of the first set of scan lines, wherein the first set of scan lines are spread over a first distance along the first direction;
   after the first set of scan lines is scanned, moving, by the multi-beam tool, the sample in the first direction by the first distance; deflecting, by the multi-beam tool, the array of beams to i) scan a second set of scan lines in the field of view of multi-beam tool and ii) follow movement of the sample during the scanning of the second set of scan lines; and
   moving, by the multi-beam tool, the sample in the first direction, when the first and second sets of scan lines are scanned.
51. The method of clause 50, wherein deflecting the array of beams to i) scan the first set of scan lines in the field of view of the multi-beam tool and ii) follow the movement of the sample during the scanning of the first set of scan lines comprises:
   deflecting a first beam in the array of beams to simultaneously i) follow the movement of the sample and ii) scan a first scan line;
   after the first scan line is scanned, deflecting the first beam by a predetermined distance along a direction opposite to the first direction; and
   deflecting the first beam to simultaneously i) follow the movement of the sample and ii) scan a second scan line.
52. The method of any one of clauses 50 and 51, wherein deflecting the array of beams to follow the movement of the sample comprises deflecting the array of beams to allow an array of probe spots formed by the array of beams on the sample to move in the first direction at a same speed as the sample.
53. The method of any one of clauses 50 to 52, further comprising: during the scanning of the first and second sets of scan lines, moving the sample in the first direction at a constant speed.
54. The method of any one of clauses 50 to 53, wherein each of the first and second sets of scan lines is spaced apart by a distance corresponding to a pixel size of an image generated by the multi-beam tool.
55. The method of any one of clauses 50 to 54, the first and second sets of scan lines are, relative to the sample, substantially perpendicular to the first direction.
56. The method of any one of clauses 50 to 55, wherein the first and second sets of scan lines are substantially parallel lines.
57. A non-transitory computer-readable medium storing a set of instructions that is executable by a controller coupled to a multi-beam tool to cause the controller to perform a method comprising:
   instructing a beam configuration system of the multi-beam tool to rotate an array of charged-particle beams relative to a sample to be scanned by the multi-beam tool, by a rotation angle determined based on a number of beams in a row of the array of beams,
   wherein the multi-beam tool generates a primary beam of charged particles and splits the primary beam into the array of charged-particle beams.
58. The medium of clause 57, wherein the array of charged-particle beams is disposed around an optical axis of the multi-beam tool, wherein the set of instructions further causes the controller to perform:
   instructing a sample stage of the multi-beam system to rotate the sample around the optical axis.

59. The medium of clause 57, wherein the array of beams is disposed around an optical axis of the multi-beam tool, wherein the set of instructions further causes the controller to perform:

instructing the beam configuration system to rotate the array of charged-particle beams around the optical axis.

60. The medium of any one of clauses 57 to 59, wherein the set of instructions further causes the controller to perform:

controlling the multi-beam tool to generate an image of a surface area of the sample; and instructing the beam configuration system to move the array of charged-particle beams across an area larger than the imaged surface area.

61. The medium of clause 60, wherein the set of instructions further causes the controller to perform:

instructing a sample stage of the multi-beam tool to move the sample along a first direction; and instructing the beam configuration system to move the array of charged-particle beams to scan a set of scan lines that cover the field of view along a second direction.

62. The medium of clause 61, wherein the second direction is, relative to the sample, substantially perpendicular to the first direction.

63. The medium of clause 61, wherein the second direction is, relative to the sample, substantially parallel to the first direction.

64. The medium of any one of clauses 61 to 63, wherein the set of scan lines is spaced apart by a distance corresponding to a pixel size of an image generated by the multi-beam tool.

65. A non-transitory computer-readable medium storing a set of instructions that is executable by a controller coupled to a multi-beam tool to cause the controller to perform a method comprising:

instructing a sample stage of the multi-beam tool to move a sample in a first direction, the multi-beam tool generating a primary beam of charged particles and splitting the primary beam into n beams, wherein n is an integer and n≥2;

instructing a beam configuration system of the multi-beam tool to rotate the n beams with reference to the first direction, such that the n beams are spaced apart along the first direction;

instructing the beam configuration system to deflect the n beams to simultaneously i) follow movement of the sample and ii) scan one or more sets of n scan lines over a surface of the sample.

66. The medium of clause 65, wherein the one or more sets of n scan lines include a first set of n scan lines spread over a first distance along the first direction, wherein the set of instructions further causes the controller to perform:

after the first set of n scan lines is scanned, instructing the beam configuration system to offset the n beams by the distance along a direction opposite to the first direction; and instructing the beam configuration system to deflect the n beams to simultaneously i) follow the movement of the sample and ii) scan a second set of n scan lines over the surface of the sample.

67. The medium of clause 66, wherein the first and second sets of n scan lines are substantially parallel lines.

68. The medium of any one of clauses 66 and 67, wherein the each of the first and second sets of n scan lines is spaced apart by a distance corresponding to a pixel size of an image generated by the multi-beam tool.

69. The medium of any one of clauses 65 to 68, wherein the set of instructions further causes the controller to perform:

instructing the beam configuration system to move, relative to the sample, the one or more sets of n scan lines along a second direction substantially perpendicular to the first direction.

70. The medium of any one of clauses 65 to 68, wherein the set of instructions further causes the controller to perform:

instructing the beam configuration system to move, relative to the sample, the one or more sets of n scan lines along a second direction substantially parallel to the first direction.

71. The medium of any one of clauses 69 and 70, wherein the first set of n scan lines covers a field of view of the multi-beam tool along the second direction.

72. The medium of any one of clauses 65 to 71, wherein the n beams are projected to the surface of the sample and form n probe spots on the surface, wherein the set of instructions further causes the controller to perform:

instructing the beam configuration system to deflect the n beams to allow the n probe spots to move in the first direction at a same speed as the sample.

73. The medium of any one of clauses 65 to 72, wherein the set of instructions further causes the controller to perform:

instructing the sample stage to move the sample in the first direction at a constant speed.

74. A non-transitory computer-readable medium storing a set of instructions that is executable by a controller coupled to a multi-beam tool to cause the controller to perform a method comprising:

instructing a sample stage of the multi-beam tool to move a sample in a first direction, the multi-beam tool generating a primary beam of charged particles and splitting the primary beam into an array of beams;

instructing a beam configuration system of the multi-beam tool to deflect the array of beams to i) scan a first set of scan lines in a field of view of the multi-beam tool and ii) follow movement of the sample during the scanning of the first set of scan lines, wherein the first set of scan lines are spread over a first distance along the first direction;

after the first set of scan lines is scanned, instructing the sample holder to move the sample in the first direction by the first distance;

instructing the beam configuration system to deflect the array of beams to i) scan a second set of scan lines in the field of view of multi-beam tool and ii) follow movement of the sample during the scanning of the second set of scan lines; and instructing the sample holder to move the sample in the first direction, when the first and second sets of scan lines are scanned.

75. The medium of clause 74, wherein the array of beams includes a first beam, wherein the set of instructions further causes the controller to instruct the beam configuration system to:

deflect the first beam to simultaneously i) follow the movement of the sample and ii) scan a first scan line;

after the first scan line is scanned, deflect the first beam by a predetermined distance along a direction opposite to the first direction; and deflect the first beam to simultaneously i) follow the movement of the sample and ii) scan a second scan line.

76. The medium of any one of clauses 74 and 75, wherein the array of beams is projected to a surface of the sample and forms an array of probe spots on the surface, wherein the set of instructions further causes the controller to further perform:

instructing the beam configuration system to deflect the array of beams to allow the array of probe spots to move in the first direction at a same speed as the sample.

77. The medium of any one of clauses 74 to 76, wherein the set of instructions further causes the controller to perform:

during the scanning of the first and second sets of scan lines, instructing the sample stage to move the sample in the first direction at a constant speed.

78. The medium of any one of clauses 74 to 77, wherein each of the first and second sets of scan lines is spaced apart by a distance corresponding to a pixel size of an image generated by the multi-beam tool.

79. The medium of any one of clauses 74 to 78, wherein the first and second sets of scan lines are, relative to the sample, substantially perpendicular to the first direction.

80. The medium of any one of clauses 74 to 79, wherein the first and second sets of scan lines are substantially parallel lines.

81. A method of scanning an area of a sample using N charged particle beams, wherein N is an integer greater than or equal to two, and wherein the area of the sample comprises a plurality of scan sections of N consecutive scan lines, comprising:

moving a position of the sample in a first direction;

scanning, with a first charged particle beam of the N charged particle beams, first scan lines of at least some scan sections of the plurality of scan sections moving towards a probe spot of the first charged particle beam; and scanning, with a second charged particle beam of the N charged particle beams, second scan lines of at least some scan sections of the plurality of scan sections moving towards a probe spot of the second charged particle beam.

82. The method of clause 81, wherein moving the position of the sample in the first direction comprises moving the position of the sample constantly at a first speed.

83. The method of any one of clauses 81 and 82, wherein the scan lines are positioned perpendicular to the first direction.

84. The method of any one of clauses 81 and 82, wherein the scan lines are tilted away from the first direction to accommodate movement of the position of the sample in the first direction.

85. The method of any one of clauses 81 to 84, wherein the first scan lines of the plurality of scan sections are positioned parallel to the second scan lines of the plurality of scan sections.

86. The method of any one of clauses 81 to 85, further comprising:

deflecting the N charged particle beams to move the probe spots of the N charged particle beams in a second direction from respective starting positions to respective end positions to follow movement of the sample while scanning a set of scan lines.

87. The method of clause 86, further comprising:

deflecting the N charged particle beams to move the probe spots of the N charged particle beams in a third direction from the respective end positions to the respective starting positions to reposition the probe spots back to the respective starting positions in preparation of scanning a next set of scan lines.

88. The method of any one of clauses 81 to 87, wherein the second direction is substantially opposite of the third direction.

89. The method of any one of clauses 86 to 88, wherein:

deflecting the N charged particle beams to move the probe spots of the N charged particle beams in the second direction comprises deflecting the N charged particle beams to move the probe spots of the N charged particle beams in the second direction at a second speed; and deflecting the N charged particle beams to move the probe spots of the N charged particle beams in the third direction comprises deflecting the N charged particle beams to move the probe spots of the N charged particle beams in the third direction at a third speed.

90. The method of clause 89, wherein the second speed and the third speed are same.

91. The method of any one of clauses 82 to 90, wherein the first speed is associated with a size of scan sections.

92. The method of any one of clauses 82 to 90, wherein the first speed is determined based on a length of the scan line, the second speed, and the third speed.

93. The method of any one of clauses 81 to 92, wherein the sample includes a wafer or a photomask.

94. A non-transitory computer readable medium storing a set of instructions that is executable by one or more processors of a charged particle beam system to cause the charged particle beam system, with a charged particle beam source to deliver N charged particle beams to a surface of a sample over a time sequence, to perform a method comprising:

moving a position of the sample in a first direction;

scanning, with a first charged particle beam of the N charged particle beams, first scan lines of at least some scan sections of the plurality of scan sections moving towards a probe spot of the first charged particle beam; and scanning, with a second charged particle beam of the N charged particle beams, second scan lines of at least some scan sections of the plurality of scan sections moving towards a probe spot of the second charged particle beam.

95. The computer readable medium of clause 94, wherein moving the position of the sample in the first direction comprised moving the position of the sample constantly at a first speed.

96. The computer readable medium of any one of clauses 94 and 95, wherein the scan lines are positioned substantially perpendicular to the first direction.

97. The computer readable medium of any one of clauses 94 to 96, wherein the first scan lines of the plurality of scan sections are positioned substantially parallel the second scan lines of the plurality of scan sections.

98. The computer readable medium of any one of clauses 94 to 97, wherein the set of instructions that is executable by the one or more processors to cause the controller to further perform:

deflecting the N charged particle beams to move the probe spots of the N charged particle beams in a second direction from respective starting positions to respective end positions to follow movement of the sample while scanning a set of scan lines.

99. The computer readable medium of clause 98, wherein the set of instructions that is executable by the one or more processors to cause the controller to further perform:

deflecting the N charged particle beams to move the probe spots of the N charged particle beams in a third direction from the respective end positions to the respective starting positions to reposition the probe spots back to the respective starting positions in preparation of scanning a next set of scan lines.

100. The computer readable medium of any one of clauses 94 to 99, wherein the second direction is substantially opposite of the third direction.

101. The computer readable medium of any one of clauses 98 to 100, wherein: deflecting the N charged particle beams to move the probe spots of the N charged particle beams in the second direction comprises deflecting the N charged particle beams to move the probe spots of the N charged particle beams in the second direction at a second speed; and deflecting the N charged particle beams to move the probe spots of the N charged particle beams in the third direction comprises deflecting the N charged particle beams to move the probe spots of the N charged particle beams in the third direction at a third speed.

102. The computer readable medium of clause 101, wherein the second speed and the third speed are substantially same.

103. The computer readable medium of any one of clauses 95 to 102, wherein the first speed is associated with a size of scan sections.

104. The computer readable medium of any one of clauses 95 to 102, wherein the first speed is determined based on a length of the scan line, the second speed, and the third speed.

105. A method of scanning a sample by a multi-beam inspection system that utilizes at least N charged particle beams, N being an integer that is greater than or equal to two, the method comprising:
positioning the N charged particle beams to enable each beam of the N charged particle beams to scan a different scan line of a first set of N adjacent scan lines;
scanning, by use of the N charged particle beams, the first set of N adjacent scan lines of a sample while the sample is moving at a first speed in a first direction;
repositioning, relative to initiation of the scanning of the first set of N adjacent scan lines, the N charged particle beams to enable each beam of the N charged particle beams to scan a different scan line of a second set of adjacent scan lines; and
scanning, by use of the N charged particle beams, the second set of N adjacent scan lines of the sample while the sample is moving at the first speed in the first direction.

106. The method of clause 105, wherein the multi-beam inspection system utilizes N-by-M charged particle beams, and wherein M is an integer that is greater than or equal to one.

107. The method of clause 106, wherein the N-by-M charged particle beams form an N-by-M array of charges particle beams, wherein M is an integer that is greater than or equal to two, and wherein the N charged particle beams are a first linear arrangement of N charged particle beams of the N-by-M array of charged particle beams.

108. The method of clause 107, wherein M equals N.

109. The method of clause 107, wherein a second set of N charged particle beams are a second linear arrangement of N charged particle beams of the N-by-M array of charged particle beams, the method further comprising:
positioning the second linear arrangement of N charged particle beams to enable each beam of the second linear arrangement of N charged particle beams to scan a different scan line of a third set of N adjacent scan lines;
scanning, by use of the second set of N charged particle beams, the third set of N adjacent scan lines of the sample while the sample is moving at the first speed in the first direction;
repositioning, relative to initiation of the scanning of the third set of N adjacent scan lines, the second linear arrangement of N charged particle beams to enable each beam of the second linear arrangement of N charged particle beams to scan a different scan line of a fourth set of adjacent scan lines; and
scanning, by use of the second set of N charged particle beams, the fourth set of N adjacent scan lines of the sample while the sample is moving at the first speed in the first direction.

110. The method of clause 109, wherein the scanning of the first set coincides with the scanning of the third set, and wherein the scanning of the second set coincides with the scanning of the fourth set.

111. The method of clause 110, wherein the scanning of the first set occurs substantially simultaneously with the scanning of the third set, and wherein the scanning of the second set occurs substantially simultaneously with the scanning of the fourth set.

112. The method of clause 105, wherein the positioning of the N charged particle beams occurs before the scanning of the first set, wherein the scanning of the first set occurs before the repositioning, wherein the repositioning occurs before the scanning of the second set, and wherein the sample is moving continuously at substantially the first speed from a time when the scanning of the first set starts to a time when the scanning of the second set ends.

113. The method of clause 105, further comprising:
repositioning, relative to initiation of the scanning of the second set of N adjacent scan lines, the N charged particle beams to enable each beam of the N charged particle beams to scan a different scan line of a third set of adjacent scan lines; and
scanning, by use of the N charged particle beams, the third set of N adjacent scan lines of the sample while the sample is moving at the first speed in the first direction,
wherein the sample is moving continuously at substantially the first speed from a time when the scanning of the first set starts to a time when the scanning of the third set starts,
wherein the first direction is substantially parallel to a y axis of the sample and movement relative to the sample in the first direction is movement in a direction of increasing y coordinate values of the y axis,
wherein a scan line at a start end of the first set is located at a y coordinate of the sample that is greater than y coordinates of all other scan lines of the first set and of the scan lines of second set and of the third set,
wherein a scan line at a start end of the third set is located at a y coordinate of the sample that is less than y coordinates of all scan lines of the first set and of the second set and that is greater than y coordinates of all other scan lines of the third set, and
wherein a distance traveled by the sample, relative to a fixed point of the multi-beam inspection system, from a time when the scanning of the first set starts to when a time when the scanning of the third set starts is substantially equal to a distance along the y-axis from the scan line at the start end of the first set to the scan line at the start of the third set.

114. The method of clause 113,
wherein the positioning of the N charged particle beams occurs before the scanning of the first set, wherein the scanning of the first set occurs before the repositioning to enable the scanning of the second set, wherein the repositioning to enable the scanning of the second set occurs before the scanning of the second set, wherein the scanning of the second set occurs before the repositioning to enable the scanning of the third set, and wherein the repositioning to enable the scanning of the second set occurs before the scanning of the third set.

115. A method of scanning a sample positioned on a stage by a multi-beam inspection system that utilizes N-by-M array of charged particle beams, N and M each being an integer that is greater than or equal to two, the method comprising:

positioning the N-by-M array of charged particle beams to enable each beam of the N-by-M array of charged particle beams at a first set of positions to scan a different scan section of a first set of N-multiplied-by-M scan sections of the sample;

scanning, by use of the N-by-M array of charged particle beams, scan lines of at least some scan sections of the first set of N-multiplied-by-M scan sections of the sample while the stage is moving at a first speed in a first direction;

repositioning, relative to initiation of the scanning of the first set of N-multiplied-by-M scan sections, the N-by-M array of charged particle beams to enable each beam of the N-by-M array of charged particle beams at a second set of positions to scan a different scan section of a second set of N-multiplied-by-M scan sections of the sample; and scanning, by use of the N-by-M array of charged particle beams, scan lines of at least some scan sections of the second set of N-multiplied-by-M scan sections of the sample while the stage is moving at the first speed in the first direction.

116. The method of clause 115, wherein the scan lines are positioned substantially parallel to the first direction.

117. The method of any one of clauses 115 and 116, further comprising: deflecting the N-by-M array of charged particle beams to accommodate movement of the stage while scanning scan lines.

118. The method of any one of clauses 115 to 117, wherein repositioning of the N-by-M array of charged particle beams occurs while the stage is moving at the first speed in the first direction.

119. The method of clause 118, further comprising: deflecting the N-by-M array of charged particle beams to accommodate movement of the stage while repositioning the N-by-M array of charged particle beams.

120. The method of any one of clauses 115 to 119, wherein corresponding positions of the first set of positions and the second set of positions of the N-by-M array of charged particle beams, relative to a fixed point of the multi-beam inspection system, are substantially the same.

121. The method of any one of clauses 115 to 120, further comprising:

rotating the N-by-M array of charged particle beams around an optical axis of the multi-beam inspection system.

122. The method of any one of clauses 115 to 120, further comprising:

rotating the stage around an optical axis of the multi-beam inspection system.

123. The method of any one of clauses 115 to 122, wherein:

a scan section of the first set of N-multiplied-by-M scan sections of the sample partially overlaps a scan section of the second set of N-multiplied-by-M scan sections of the sample to create an overlapped region.

124. The method of clause 123, wherein the overlapped region is scanned multiple times.

125. The method of clause 124, wherein the overlapped region is scanned a first time when the first set of N-multiplied-by-M scan sections of the sample is scanned, and the overlapped region is scanned a second time when the second set of N-multiplied-by-M scan sections of the sample is scanned.

126. The method of clause 125, further comprising:

acquiring a first scanned data of the overlapped region while scanning the first set of N-multiplied-by-M scan sections of the sample;

acquiring a second scanned data of the overlapped region while scanning the second set of N-multiplied-by-M scan sections of the sample; and processing the first and the second scanned data of the overlapped region to produce a continuous image of the sample.

127. The method of any one of clauses 115 to 126, further comprising: controlling, by a controller coupled with the stage, a movement of the stage.

128. The method of any one of clauses 115 to 127, wherein M equals N.

It is appreciated that the multi-beam electron beam tool may use software to perform the functionality described above. For example, the multi-beam electron beam tool may control the motorized sample stage to move the sample while scanning is in progress. Also, the multi-beam electron beam tool may control and deflect the primary beamlets to move the probe spots along the scan lines while the sample moves constantly. Furthermore, the multi-beam electron beam tool may perform image processing to generate the beam spot images of the received secondary electron beams. The software may be stored on a non-transitory computer readable medium. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, cloud storage, a FLASH-EPROM or any other flash memory, NVRAM, a cache, a register, any other memory chip or cartridge, and networked versions of the same.

Although the disclosed embodiments have been explained in relation to its preferred embodiments, it is to be understood that other modifications and variation can be made without departing from the spirit and scope of the subject matter as hereafter claimed.

What is claimed is:

1. A multi-beam tool comprising:

a beam configuration system including a charged-particle source for generating a primary beam of charged particles, a stage configured to hold a sample, and a deflector system between the charged-particle source and the stage configured to split the primary beam into an array of beams, wherein the beam configuration system is configured to:

provide a rotated beam configuration with a rotation angle determined based on a number of beams in a row of the array of beams, and deflect the array of beams to simultaneously i) follow movement of the stage at a same speed as the stage and ii) scan one or more sets of scan lines over a surface area of the sample.

2. The multi-beam tool of claim 1, wherein:

the array of beams is disposed around an optical axis of the multi-beam tool; and the rotated beam configuration includes the stage being configured to be rotated around the optical axis.

3. The multi-beam tool of claim 1, wherein:
the array of beams is disposed around an optical axis of the multi-beam tool; and
the rotated beam configuration includes the deflector system being configured to rotate the array of beams around the optical axis.

4. The multi-beam tool of claim 1, wherein:
the multi-beam tool is configured to generate an image of the surface area of the sample; and
the rotated beam configuration enables the array of beams to scan an area larger than the imaged surface area.

5. The multi-beam tool of claim 1, wherein:
the stage is configured to move along a first direction; and
the beam configuration system is configured to scan the one or more sets of scan lines along a second direction.

6. The multi-beam tool of claim 5, wherein the second direction is, relative to the sample, substantially perpendicular to the first direction.

7. The multi-beam tool of claim 5, wherein the second direction is, relative to the sample, substantially parallel to the first direction.

8. The multi-beam tool of claim 5, wherein the one or more set of scan lines is spaced apart by a distance corresponding to a pixel size of an image generated by the multi-beam tool.

9. The multi-beam tool of claim 1, wherein the beam configuration system further includes a controller coupled with the stage, the controller being configured to control movement of the stage.

10. The multi-beam tool of claim 1, wherein the beam configuration system further includes a controller coupled with the deflector system, the controller being configured to control the deflector system to deflect the array of beams.

11. A method comprising:
generating, by a multi-beam tool, a primary beam of charged particles;
splitting, by the multi-beam tool, the primary beam into an array of beams;
causing, by the multi-beam tool, the array of beams to have a rotated orientation, relative to a sample to be scanned, by a rotation angle determined based on a number of beams in a row of the array of beams; and
deflecting the array of beams to simultaneously i) follow movement of the stage at a same speed as the stage and ii) scan one or more sets of scan lines over a surface area of the sample.

12. The method of claim 11, wherein causing the array of beams to have a rotated orientation relative to the sample comprises rotating the sample around an optical axis of the multi-beam tool.

13. The method of claim 11, wherein causing the array of beams to have a rotated orientation relative to the sample comprises rotating the array of beams around an optical axis of the multi-beam tool.

14. The method of claim 11, wherein causing the array of beams to have a rotated orientation relative to the sample enables the array of beams to scan an area larger than a sample surface area imaged by the multi-beam tool.

15. The method of claim 11, further comprising:
moving, by the multi-beam tool, the sample along a first direction,
wherein the array of beams scan the one or more set of scan lines that cover the imaged surface area along a second direction.

* * * * *